(12) United States Patent
De Meijer et al.

(10) Patent No.: US 10,206,308 B2
(45) Date of Patent: Feb. 12, 2019

(54) MODULE FOR COOLING A HEAT GENERATING COMPONENT

(71) Applicant: NERDALIZE B.V., Delft (NL)

(72) Inventors: Mathijs De Meijer, Delft (NL); Remy Van Rooijen, Delft (NL); Marinus Schoute, Zoetermeer (NL); Thomas De Jong, Hoofddorp (NL); Boaz Samuel Leupe, Rotterdam (NL); Florian Jacob Schneider, The Hague (NL)

(73) Assignee: NERDALIZE B.V., Delft (NL)

( * ) Notice: Subject to any disclaimer, the term of this patent is extended or adjusted under 35 U.S.C. 154(b) by 0 days.

(21) Appl. No.: 15/557,838

(22) PCT Filed: Mar. 16, 2016

(86) PCT No.: PCT/EP2016/055711
§ 371 (c)(1),
(2) Date: Sep. 13, 2017

(87) PCT Pub. No.: WO2016/146698
PCT Pub. Date: Sep. 22, 2016

(65) Prior Publication Data
US 2018/0295745 A1 Oct. 11, 2018

(30) Foreign Application Priority Data

Mar. 16, 2015 (NL) ..................... 2014466

(51) Int. Cl.
*H05K 7/20* (2006.01)
*G06F 1/20* (2006.01)

(52) U.S. Cl.
CPC .......... *H05K 7/20336* (2013.01); *G06F 1/20* (2013.01); *H05K 7/20818* (2013.01); *G06F 2200/201* (2013.01); *H05K 7/20936* (2013.01)

(58) Field of Classification Search
USPC ................................................. 361/679.52
See application file for complete search history.

(56) References Cited

U.S. PATENT DOCUMENTS

| 5,373,417 A | 12/1994 | Barrett |
| 7,506,682 B2 * | 3/2009 | Bhatti .................. H01L 23/427 165/104.14 |

(Continued)

FOREIGN PATENT DOCUMENTS

| EP | 2665349 A1 | 11/2013 |
| EP | 2802197 A1 | 11/2014 |

OTHER PUBLICATIONS

International Preliminary Report on Patentability dated Jul. 4, 2017; written reply and claims dated Jan. 16, 2017; (PCT/EP2016/055711); 25 pages.

*Primary Examiner* — Mukund G Patel
(74) *Attorney, Agent, or Firm* — Shay Glenn LLP

(57) ABSTRACT

The present invention relates to a module for cooling heat generating components, in particular for cooling electronic components of a computer device, such as processors, memory modules, storage modules, that may be arranged on a motherboard. The method according to the invention, comprises at least one heat generating component, a gastight chamber having an interior volume having arranged therein a heat-transfer fluid in liquid phase that is in heat transfer contact with at least part of the heat generating component and a heat exchanging surface for transferring heat from the heat-transfer fluid out of the gastight chamber, wherein the gastight chamber comprises a displaceable wall by means of which the interior volume of the gastight chamber is variable, and wherein the interior volume of the gastight chamber is in pressure equilibrating connection with the ambient pressure outside the gastight chamber via the displaceable (Continued)

wall of the gastight chamber. The displaceable wall is at least partly in contact with the heat-transfer fluid in liquid phase.

34 Claims, 9 Drawing Sheets

(56) References Cited

U.S. PATENT DOCUMENTS

| | | | |
|---|---|---|---|
| 2009/0199999 A1* | 8/2009 | Mitic | F28D 15/0241 165/104.26 |
| 2014/0071625 A1* | 3/2014 | Luo | H05K 7/20236 361/699 |
| 2014/0216711 A1 | 8/2014 | Shelnutt et al. | |

* cited by examiner

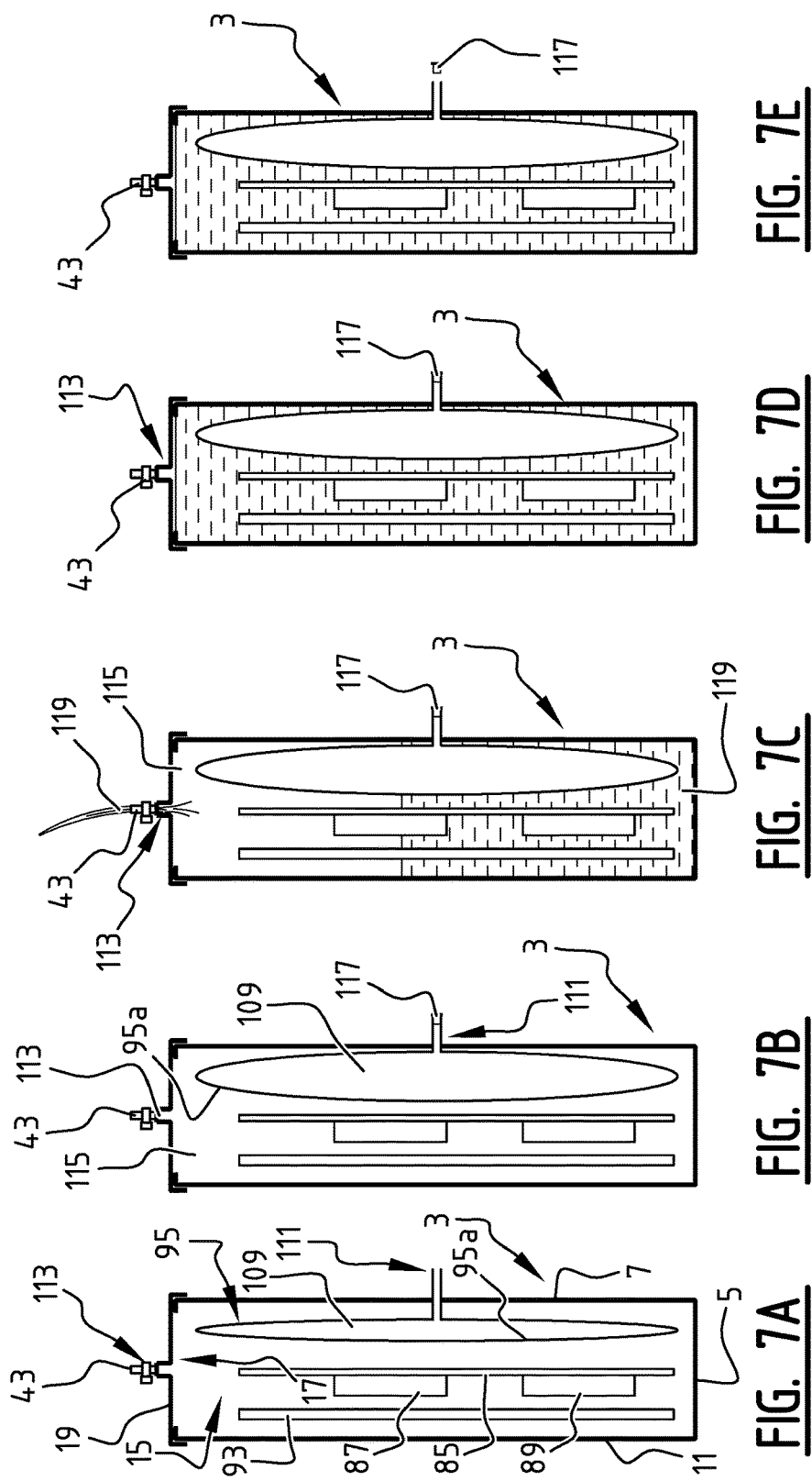

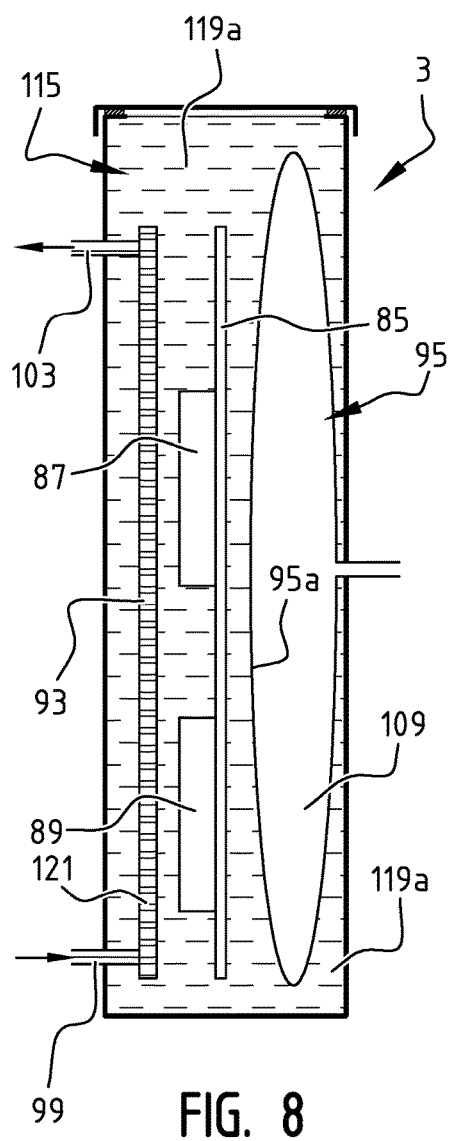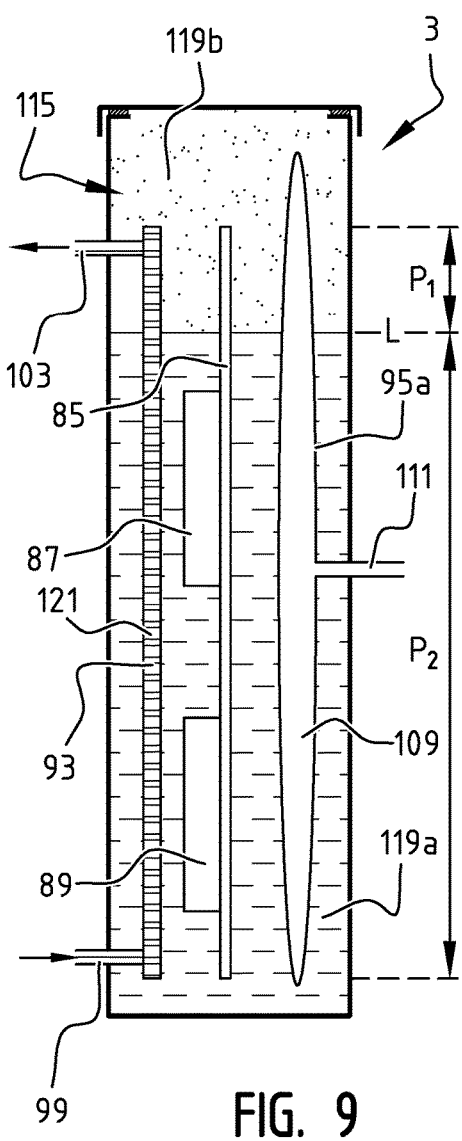

MODULE FOR COOLING A HEAT GENERATING COMPONENT

The present invention relates to a module for cooling heat generating components, in particular for cooling electronic components of a computer device, such as processors, memory modules, storage modules, that may be arranged on a motherboard.

Electronic components of a computer device generate heat as a byproduct of the operation of the computer device to perform useful computing tasks. Overheating of the electronic components of a computer device may result in decreased performance of the computer device and even malfunctioning of the computer device.

In order to prevent overheating the electronic components are generally cooled during the use thereof by extracting heat from said electronic components and transporting the heat away therefrom. The extracted heat is subsequently for instance emitted to the environment of the computer device as waste heat. Instead of letting the extracted heat go to waste, it is also known to make use of the heat extracted from the electronic components and transported away therefrom, for instance to heat rooms.

It is common to use air as a transfer medium to extract heat from the electronic components and transport the extracted heat away from the computer device. Whether or not making use of the heat extracted from the electronic components and transported away from the computer device, the use of air as a transfer medium has its limitations in terms of efficiency. In view thereof other transfer media have been proposed for extracting heat from the electronic components and transport the extracted heat away therefrom. A promising development in that respect is the use of a cooling liquid as a transfer medium. However, the known technical implementations of this use of a cooling liquid as a transfer medium are complex in terms of construction as a result costly to manufacture.

The present invention has as one of its objects to provide an improved technical implementation of the use of a cooling liquid as transfer medium for cooling heat generating components.

The present invention proposes a module for cooling a heat generating component, comprising:
  at least one heat generating component;
  a gastight chamber having an interior volume having arranged therein:
    a heat-transfer fluid in liquid phase that is in heat transfer contact with at least part of the heat generating component; and
    a heat exchanging surface for transferring heat from the heat-transfer fluid out of the gastight chamber;
wherein
  the gastight chamber comprises a displaceable wall by means of which the interior volume of the gastight chamber is variable; and
  the interior volume of the gastight chamber is in pressure equilibrating connection with the ambient pressure outside the gastight chamber via the displaceable wall of the gastight chamber.

In the module according to the invention a heat-transfer fluid in liquid phase is used to extract heat from a heat generating component and to transfer the extracted heat to a heat exchanging surface that is also arranged in the gastight chamber for further transport of the extracted heat out of the gastight casing. Because in the module according to the invention the heat-transfer fluid in liquid phase and the heat exchanging surface are arranged in a gastight chamber that comprises a displaceable wall by means of which the interior volume of the gastight chamber is variable and via which the interior volume is in pressure equilibrating connection with the ambient pressure outside the module, the module according to the invention allows for expansion of the heat-transfer fluid in the gastight chamber while retaining the heat-transfer fluid in the gastight chamber and while keeping the pressure inside the gastight chamber at substantially the same pressure as the ambient pressure outside the gastight chamber. As a result the heat-transfer fluid is allowed to remain inside the gastight chamber, without the gastight chamber having to be constructed as a pressure vessel, and without the provision of a system for evacuating heat-transfer fluid out of the gastight chamber when the heat-transfer fluid expands and for reintroducing evacuated heat transfer fluid when the heat transfer fluid contracts. As a result the module according to the invention can be of a relatively simple, cost efficient design.

According to the present invention the displaceable wall is at least partly in contact with the heat-transfer fluid in liquid phase. This allows for a displacement of the displaceable wall to result in a change of the liquid level of the heat-transfer fluid in liquid phase. In particular, the displaceable wall being at least partly in contact with the heat-transfer fluid in liquid phase allows for a drop of the liquid level of the heat-transfer fluid in liquid phase in case during operation of the heat generating component the pressure in the gastight chamber increases when heat-transfer fluid in gas phase collects above the liquid level of the heat-transfer fluid, thereby preventing a pressure difference between the pressure inside the gastight chamber and the ambient pressure outside the gastight chamber. Once the pressure in the gastight chamber decreases as a result of a decrease of the amount of heat-transfer fluid in gas phase above the liquid level of the heat-transfer fluid, the displaceable wall allows for a rise of the liquid level of the heat-transfer fluid, thereby preventing a pressure difference between the pressure inside the gastight chamber and the ambient pressure outside the gastight chamber.

Preferably, the displaceable wall is freely displaceable, such that the wall displaces as a result of a pressure difference between the pressure inside the gastight chamber and the ambient pressure outside the gastight chamber. Alternatively, the displaceable wall could be selectively displaceable, i.e. by means of an actuator. In the latter case, a controller and pressure sensors may be provided, wherein the controller is configured to control the displacement of the displaceable wall on the basis of a measured pressure inside the gastight chamber and a measured pressure outside the gastight chamber in order to provide the pressure equilibrating connection.

Despite its relatively simple design, the module according to the invention allows for embodiments utilizing efficient cooling techniques, as will be discussed herein below.

In an advantageous embodiment of the module according to the invention, the heat-transfer fluid has a boiling point being lower than or equal to an operating temperature of the heat generating component in use; and the heat exchanging surface is arranged such that at least in use at said operating temperature of the heat generating component at least part of the heat exchanging surface extends above the liquid level of the heat-transfer fluid.

When in this embodiment the heat generating component is operated at a temperature at or above a boiling point of the heat-transfer fluid, heat is transferred from the heat generating component to the heat-transfer fluid, thereby causing the heat-transfer fluid to boil where it is in heat-transfer contact with the heat generating component such that heat-transfer fluid in gas-phase is generated in the gastight chamber. As a result the volume of the heat-transfer fluid expands, causing the displaceable separation wall to displace such that the volume of the gastight chamber increases, and the pressure in the gastight chamber remains equal to the ambient pressure outside the gastight chamber. The heat-transfer fluid in gas phase will rise in upward direction towards the top of the gastight chamber and will collect above the liquid level of the heat-transfer fluid. Above the liquid level of the heat-transfer fluid the heat-transfer fluid in gas phase will come into contact with the part of the heat exchanging surface that extends above the liquid level of the heat-transfer fluid and will condense on the heat exchanging surface, thereby changing into its liquid phase and returning to the remainder of the heat transfer fluid in liquid phase. This advantageous embodiment thus allows for an operation of the module according to the invention wherein the heat-transfer fluid undergoes a first phase change where it is in heat-transfer contact with the heat generating component, thereby removing heat (energy) from the heat generating component, and a second phase change where it comes into contact with the heat exchanging surface, thereby transferring heat (energy) to the heat exchanging surface. This so-called "phase change cooling" of the heat generating component is more efficient for cooling the heat generating component than so-called "non-phase change" cooling, wherein heat is transferred from the heat generating component to the heat exchanging surface while the heat-transfer fluid remains in liquid phase. Because, as a result of the construction of the module according to the invention, the volume of the heat-transfer fluid in the gastight chamber is allowed to expand while the pressure in the gastight chamber is kept at substantially the same pressure as the ambient pressure outside the gastight chamber, this "phase change cooling" that goes with a relatively high expansion of the heat-transfer fluid can be utilized without the gastight chamber having to be constructed as a pressure vessel, and without the provision of a system for evacuating heat transfer fluid out of the gastight chamber when the heat-transfer fluid expands and for reintroducing evacuated heat transfer fluid when the heat transfer fluid contracts.

In a preferred embodiment of the module according to the invention having the above advantageous construction allowing "phase change cooling", the heat exchanging surface is arranged such that at least in use at said operating temperature of the heat generating component a part of the heat exchanging surface extends above the liquid level of the heat-transfer fluid and a part is submerged in the heat-transfer fluid in liquid phase.

With this embodiment a combination of "phase change cooling" and "non-phase change cooling" is possible wherein part of the heat transfer is between the heat generating component and the part of the heat exchanging surface that is submerged in the heat-transfer fluid in liquid phase by means of heat-transfer fluid that remains in its liquid phase, and part of the heat transfer is between the heat generating component and the part of the heat exchanging surface that extends above the liquid level by means of heat-transfer fluid that undergoes the phase change from liquid to gas and vice versa. This embodiment can be advantageous in case there is a plurality of heat generating components operating simultaneously, wherein the respective heat generating components operate at different temperatures, for instance one that operates at a temperature at or above a boiling point of the heat-transfer fluid and one that operates at a temperature below said boiling point of the heat-transfer fluid.

In a particular preferred embodiment of the module according to the invention the displaceable wall is at least partly in contact with the heat-transfer fluid in liquid phase, and the heat exchanging surface is arranged such that when the liquid level of the heat-transfer fluid in liquid phase drops as a result of a displacement of the displaceable wall, at least a part of the heat exchanging surface emerges from the heat-transfer fluid in liquid phase. These features provide that when the heat generating component is operated at a temperature at or above a boiling point of the heat-transfer fluid such that heat-transfer fluid in gas phase is generated as described herein above, the generated heat-transfer fluid in gas phase collects above the liquid level of the heat-transfer fluid, thereby forcing the liquid level to drop such that at least a part of the heat exchanging surface emerges from the heat-transfer fluid in liquid phase. The more heat-transfer fluid in gas phase is generated, the more the liquid level will be forced to drop and the greater will be the part of the heat exchanging surface that extends above the liquid level, and the lesser will be the part of the heat exchanging surface that remains submerged in the heat-transfer fluid in liquid phase. As a result the more heat-transfer fluid in gas phase is generated, the greater will be the part of the heat exchanging surface that is available above the liquid level for condensation of the heat-transfer fluid in gas phase, and vice versa. Thus a self-balancing cooling system is realized with a very simple design of the module according to the invention.

In an advantageous embodiment of the module according to the invention having the above advantageous construction allowing phase change cooling, a nucleation promoting structure is arranged in the interior volume where the heat-transfer fluid is in heat exchanging contact with the heat generating component.

In this embodiment the nucleation promoting structure promotes the formation and release of gas bubbles, thus promoting the phase change of the heat-transfer fluid from liquid to gas. This improves the phase change cooling. Such a nucleation promoting structure is in particular advantageous when arranged on parts of the surface that is in heat exchange contact with the heat-transfer fluid in liquid phase where there is a relatively high heat density. Advantageous embodiments of a nucleation promoting structure include: a finned heatsink, for instance made of a metal such as Copper; a Boiling Enhancing Coating (BEC); an open cell foam of a material that is a good heat conductor, for instance made of a metal such as Copper; and the structure that results from a surface treatment of a surface that is in heat exchange contact with the heat-transfer fluid in liquid phase, which surface treatment increases the number of nucleation sites, for instance by roughening the surface. In general a nucleation promoting structure is a good heat conductor and has many nucleation sites.

In an advantageous embodiment of the module according to the invention the heat exchanging surface is arranged such that in use when the heat generating component is not operated, the whole heat exchanging surface is submerged in the heat-transfer fluid in liquid phase. In this embodiment, when the heat generating component is operated at a temperature below a boiling temperature of the heat-transfer fluid, the whole heat exchanging surface is submerged, and full use is made of the heat exchanging surface for non-phase change cooling.

Alternatively, a part of the heat exchanging surface extends above the liquid level of the heat transfer fluid when the heat generating component is not operated. When in this alternative embodiment the temperature of a heat generating component increases from a temperature below a boiling temperature of the heat-transfer fluid to a temperature at or above the a boiling temperature of the heat-transfer fluid, in particular during start-up of the module, there is already heat exchanging surface available above the liquid level when the first heat-transfer fluid in gas phase emerges from the heat-transfer fluid in liquid-phase. This has the advantage that the phase change cooling can start without having to wait for enough heat-transfer fluid in gas-phase to have been generated to drop the liquid level of the heat-transfer fluid enough to expose a part of the heat exchanging surface.

In a preferred embodiment of the module according to the invention, the module comprises a gastight casing having a fixed interior volume having arranged therein the displaceable wall, the displaceable wall defining in the fixed interior volume of the gastight casing a gastight first variable volume chamber being the gastight casing in which the heat-transfer fluid and the heat exchanging surface are arranged and a second variable volume chamber, the internal volume of the second variable volume chamber being in pressure equilibrating connection with the ambient pressure outside the gastight casing.

In this embodiment the module according to the invention all components are arranged inside a single gastight casing. Expansion of the heat-transfer fluid is allowed in first variable volume chamber while retaining the heat transfer fluid in a fixed interior volume of the gastight casing and while keeping the pressure inside the gastight casing at substantially the same pressure as the ambient pressure outside the gastight casing. As a result the transfer fluid is allowed to remain inside the first variable volume chamber to keep carrying out its function of transferring heat from the heat generating component to the heat exchanging surface, without the gastight casing having to be constructed as a pressure vessel, and without the provision of a system for evacuating heat transfer fluid out of the gastight casing when the heat-transfer fluid expands and for reintroducing evacuated heat transfer fluid when the heat transfer fluid contracts. As a result the module according to this preferred embodiment can be a self contained module of a relatively simple, cost efficient design.

In an advantageous embodiment thereof, a bellows is arranged in a fixed interior volume of the gastight casing, said bellows providing the displaceable wall, the bellows dividing said volume of the gastight casing in which it is arranged in the first variable volume chamber and the second variable volume chamber, the interior of the bellows defining the second variable volume chamber, and the bellows being connected to the gastight casing for pressure equation between the interior of the bellows and the outside environment of the gastight casing.

The bellows, preferably comprising a flexible bag of a gastight material, allows for a effective displaceable wall by means of which the first and second variable chamber can be easily created by simply arranging the bellows in the fixed volume of the gastight casing and by connecting the interior volume of the bellows to the gastight casing for pressure equation between the interior of the bellows and the outside environment of the gastight casing. In a preferred embodiment the connection of the interior volume of the bellows to the gastight casing for pressure equation between the interior of the bellows and the outside environment of the gastight casing is by means of an open conduit extending through an exterior wall of the gastight casing via which conduit the interior of the bellows is in open connection with the outside environment of the gastight casing.

In a preferred embodiment of the module according to the invention comprising a gastight casing as described herein above, an exterior wall of the gastight casing comprises a laminate of a gastight wall panel having an inside surface facing the interior of the gastight casing and an outside surface, and a layer of a thermal insulating material adhered to the outside surface of said gastight wall panel. The layer of a thermo insulating material provides thermal insulation for reducing the transfer of heat between the interior volume of the gastight casing and the exterior of the gastight casing via the exterior wall of the gastight casing instead of the transfer of heat between the interior volume of the gastight casing and the exterior of the gastight casing via the heat exchanging surface. By adhering the layer of a thermal insulating material to the outside surface of said gastight wall panel of the gastight casing a laminate is created in which the layer of a thermal insulating material and the gastight wall panel constructively cooperate to increase the strength and stiffness of the exterior wall of the gastight casing, thus allowing the gastight wall panel to be thinner. This allows to reduce the weight and cost of the gas tight wall panel, which is in particular advantageous when a high grade material is to be used for the gas tight wall panel to withstand corrosive and aggressive heat transfer fluids. Preferably, an exterior wall panel is adhered to the layer thermal insulating material on the opposite side thereof, such that a sandwich construction is formed in which the interior wall panel and the exterior wall panel function as the skins of the sandwich construction and the layer of thermal insulating material as the core of the sandwich construction. This results in an additional increase of the strength and stiffness of the exterior wall of the gastight casing, thus allowing the gastight wall panel to be thinner.

In an alternative embodiment of the module according to the invention, an exterior wall of the gastight casing comprises a sandwich construction comprising an interior wall panel and an exterior wall panel as skins having arranged there between a honeycomb core layer, preferably of a material having a relatively low thermal conductivity, wherein the cells of the honeycomb core layer are vacuumized.

In order to reduce heat loss through radiation the walls of the casing, or where applicable at least one of the layers of each of said walls, are advantageously made of a material that is highly reflective in the IR-spectrum.

In a further advantageous embodiment of the module according to the invention, the gastight casing comprises an access opening to its interior volume and a removable lid for gastight closing said access opening.

Such an access opening in combination with a removable lid allows for easy assembly of the module according to the invention as well as for easy access to the interior of the gastight casing for maintenance of the components.

In an advantageous embodiment thereof, the lid has attached to its interior surface a mounting member for mounting thereto the heat generating component.

The provision of a lid having attached to its interior surface a mounting member for mounting thereto the heat generating component, allows for the installation or removal of the heat generation component together with the installation or removal of the lid. The mounting member is advantageously a tray, wherein preferably guides are provided for guiding the movement of the lid and the tray relative to the access opening when removing the lid from the access opening and when arranging the lid on the access opening.

In a preferred embodiment of the module according to the invention, the at least one heat generating component includes an electronic computer component that in use generates heat. Electronic computer components generate heat as a byproduct of the operation of the computer device to perform useful computing tasks. Including electronic computer components in the module according to the invention as heat generating components to be cooled, allows the module according to the invention to be embodied as a particularly effective cooled computer device. Electronic components that generate heat and that can be effectively cooled in the module according to the invention include motherboards, CPU's, memory modules, and data storage modules, such as non-volatile data storage modules.

Although the module according to the invention could include only a single heat generation component, the module according to the invention may include a plurality of heat generating components. In particular in case the module according to the invention is build as a computer device the module could include one or more motherboards, each having arranged thereon one or more CPU's and one or more memory modules and each being connected to one or more data storage modules. In such a case, the module includes a plurality of heat generating components. Furthermore, a heat generating component may be build of a plurality of heat generating components. An example of a heat generating component that is build of a plurality of heat generating components is a motherboard. In a preferred embodiment of the module according to the invention, the module includes a plurality of electronic computer components that together embody a computer device. It would also be possible that a module according to the invention includes one or more motherboards having arranged thereon one or more CPU's and one or more memory modules, and that in use this module is connected to a second module including one or more data storage modules. Thus the electronic computer components that together build a computer device may be divided over several electronically interconnected modules.

In an additional or alternative embodiment of the module according to the invention wherein the at least one heat generating component includes an electronic computer component, the at least one heat generating component includes a power supply.

Power supplies, in particular power supplies of a computer device, generate heat as a byproduct of the operation thereof and the operation of the electronic computer components powered by said power supply. Also power supplies are heat generating components that can be effectively cooled in a module according to the invention. In particular when electronic computer components are includes in a module according to the invention as heat generating components it is advantageous to include in the module as heat generating component also a power supply for supplying power to the electronic computer components.

In a preferred embodiment of the module according to the invention at least one electronic connector structure is provided in a wall of the gastight chamber for electronically connecting to the heat generating component from the outside of the gastight chamber.

This allows for a wired electronic connection from the outside of the gastight chamber to the heat generating component inside the gastight chamber, for instance a data exchange connection or power connection.

In an advantageous embodiment thereof the electronic connector structure comprises a circuit board that is arranged on the inside or outside surface of an exterior wall of the gastight chamber covering a hole in said wall of the gastight casing, wherein a gastight seal is arranged around the hole between the surface of the exterior wall of the gastight chamber and the surface of the circuit board facing said surface of the exterior wall.

A circuit board is gastight as a result of the copper layer(s) incorporated therein, thereby providing a simple and relatively low cost gastight cover for a hole in an exterior wall of the gastight chamber that allows for a wired electronic connection between opposite surfaces of the circuit board. Alternative solutions for providing a wired connection through a wall of a gastight container wherein cables protrude through the wall of the container and a gastight seal is provided between the wall and the jacket of the cable suffer from gas/liquid seepage through the cable itself, that is gas/liquid seepage between the conductor wires and the insulation layer provided thereon and between the insulated conductor wires and the jacket. Such solutions require the use of special gastight cables, making such solutions very expensive. By means of a wired connection via the circuit board of the electronic connector structure of this embodiment such seepage of gas/liquid is prevented and stock cables can be used on each side of the electronic connector structure.

Advantageously, an adhesive, preferably epoxy resin, is used to adhere the circuit board to the surface of the exterior wall of the gastight chamber wherein the adhesive provides a gastight seal around said hole.

In an advantageous embodiment of the module according to the invention including an electronic connector structure, an electronic connector is arranged on at least one face of the circuit board. An electronic connector, such as a RJ45 female connector, allows for connecting an electronic cable, such an ethernet cable having at one end an RJ45 male connector, to the electronic connector structure. Electronically interconnected electronic connectors are advantageously arranged on opposite faces of the circuit board, wherein one of the electronic connectors extend through the hole covered by the circuit board. This allows for the use of two electronic cables having (standardized) connectors, one cable inside the gastight chamber and one cable outside the gastight chamber to provide a wired electronic connection between the outside and inside of the gastight chamber.

Alternatively wireless connectors may be provided on the inside and outside of the gastight chamber for providing an electronic connection from the outside of the gastight chamber to the heat generating component inside the gastight chamber. For instance wireless connectors on opposite sides of an external wall of the gastight chamber. Alternatively, it would be possible to only provide a wireless connector on the inside of the gastight chamber. The use of wireless connector(s) would require the exterior wall of the gastight chamber to be made of a material that allows wireless connection between the outside and inside of the gastight chamber, such as non-conductive plastics. Alternatively, a (part of a) metal casing could be used as an antenna for providing a wireless connection.

In a preferred embodiment of the module according to the invention the heat generating component is arranged in the interior volume of the gastight chamber.

This allows for the heat transfer liquid to be in direct heat transfer contact with the heat generating component, thus avoiding material separating the heat-transfer fluid and the heat generating component and adding thermal resistance between the heat-transfer fluid and the heat generating component. In a preferred embodiment thereof, the heat-transfer fluid is a dielectric fluid.

The use of dielectric fluid as heat-transfer fluid allows for electronic components of the heat generating component to be electrically exposed to the heat-transfer fluid. This has the advantage that there is no material required to electrically separate electronic components of the heat generating component from the heat-generating fluid, thus avoiding thermal resistance between the heat-transfer fluid and the heat generating component. The use of dielectric fluid as heat-transfer fluid in particular allows for including in the module according to the invention heat-generating components that are not designed to be in contact with the heat-transfer fluid used in the module.

Instead of using a dielectric fluid as heat-transfer fluid it is possible to arrange a layer of material on the heat generating component that electrically separates electronic components of the heat generating component from the heat-transfer fluid. Alternatively, the heat-generating component is arranged in a separate chamber and via a heat-conducting wall between the gastight chamber and the chamber in which the heat-generating component is arranged in heat-transfer contact with the heat-transfer fluid.

In a preferred embodiment of the module according to the invention, the heat exchanging surface extends parallel to a plane and the heat generating component has a planar face extending parallel to said plane and facing said heat exchanging surface.

This allows the distance between the heat generating component and the heat exchange surface over which the heat-transfer fluid in liquid phase has to transfer heat from the heat generating component to the heat exchanging surface to be relatively short.

In an advantageous embodiment of the module according to the invention, the heat exchanging surface in use extends parallel to the vertical plane and the heat generating component is arranged underneath or besides the heat exchanging surface.

In this embodiment, use can be made of natural convection in the heat-transfer fluid in liquid phase that occurs when the heat-transfer fluid in liquid phase is heated, for generating a motion of the heat-transfer fluid in liquid phase in order to transport heated heat-transfer fluid in liquid phase to the heat exchanging surface and to transport heat-transfer fluid cooled at the heat exchanging surface back to the heat generating component for reheating. This has the advantage that heat-transfer from the heat generating component to the heat exchanging surface by means of the heat-transfer fluid in liquid phase is improved without the use of a device such as a pump or a fan.

The same use of natural convection can be used in an embodiment wherein the heat exchanging surface in use extends parallel to the horizontal plane and the heat generating component is arranged underneath the heat exchanging surface.

In case use is made in a module according to the invention of phase change cooling as described herein above, the gas bubbles that are generated rise towards the liquid level of the heat-transfer fluid and the droplets heat-transfer fluid that are generated on the heat exchanging surface above the liquid level fall back into the heat-transfer fluid in liquid phase, thereby also generating motion of the heat-transfer fluid in liquid phase. In the space above the liquid level of the heat-transfer fluid where the heat-transfer fluid in gas phase collects, also natural convection occurs as a result of the rising of the heat-transfer fluid in gas phase in said space.

In an advantageous embodiment of the module according to the invention the heat exchanging surface comprises a surface of a heat exchanger comprising a circuit for a second heat-transfer fluid, and an inlet and an outlet provided in a wall of the gastight chamber.

In this embodiment a second heat-transfer fluid can be used to extract heat from the first heat-transfer fluid at the heat exchanging surface arranged in the gastight chamber and transfer the extracted heat out of the gastight chamber by transporting the heated second heat-transfer fluid out of the gastight chamber via the outlet.

In an advantageous embodiment thereof the heat exchanger comprises capillary channels as part of the circuit for a second heat-transfer fluid.

A heat exchanger comprising capillary channels provide an effective heat exchange in a module according to the invention both for cooling heated heat-transfer fluid in liquid phase when using non-phase change cooling and for cooling heated heat-transfer fluid in gas phase when using non-phase change cooling.

Preferably the heat-exchanger is a body arranged in the gastight chamber. Alternatively, the heat exchanger is integrated in one of the walls of the gastight chamber.

According to an advantageous embodiment, the heat-exchanging surface is shaped to conform the contour of the heat-generating components. With such an embodiment it is possible that the heat-exchanging surface can be arranged close to the surface of the heat-exchanging component in case the surface of the heat-exchanging component is not planar. Having the surface of the heat-generating component closer to the heat-exchanging surface shortens the distance over which the heat-transfer fluid has to transport the heat from the heat-generating component to the heat-exchanging surface.

The present invention further relates to a method for operating a module according to the invention as described herein above, comprising the steps of:

operating the heat generating component at a temperature below a boiling point of the heat-transfer fluid;
transferring heat from the heat generating component to the heat-transfer fluid in liquid phase, thereby causing the heat-transfer fluid in liquid phase to expand and the displaceable wall to displace such that the volume of the gastight chamber increases.

As a result of the increase in volume of the gastight chamber by displacement of the displaceable wall, the pressure in the gastight chamber remains equal to the ambient pressure outside the gastight chamber. This method of operation allows for non-phase change cooling for cooling the heat generating component. This non-phase change cooling is described herein above with respect to the module according to the invention. To complete the non-phase change cooling, heat is extracted from the heat-transfer fluid in liquid phase at the heat exchanging surface arranged in the gastight chamber.

According to an additional or alternative method for operating a module according to the invention as described herein above, the method comprises the steps of:

operating the heat generating component at a temperature at or above a boiling point of the heat-transfer fluid;
transferring heat from the heat generating component to the heat-transfer fluid in liquid phase, thereby causing the heat-transfer fluid to boil where it is in heat-transfer contact with the heat generating component such that heat-transfer fluid in gas phase is generated in the gastight chamber, and the displaceable wall to displace.

As a result of the increase in volume of the gastight chamber by displacement of the displaceable wall, the pressure in the gastight chamber remains equal to the ambient pressure outside the gastight chamber. This method of operation allows for phase change cooling for cooling the heat generating component. This phase change cooling is described herein above with respect to the module according to the invention. To complete the phase change cooling, heat is extracted from the heat-transfer fluid in gas phase at the heat exchanging surface arranged in the gastight chamber.

Combining both above methods of operation allow for a combination of phase change cooling and non-phase change cooling.

In a preferred embodiment of the method of operating a module according to the invention wherein the heat generating component is operated at a temperature at or above a boiling point of the heat-transfer fluid, the displaceable wall is in contact with the heat-transfer fluid in liquid phase, and the generated heat-transfer fluid in gas phase collects above the liquid level of the heat-transfer fluid forcing the liquid level to drop such that at least a part of the heat exchanging surface emerges from the heat-transfer fluid in liquid phase.

This method of operation allows for a self-balancing cooling system using both non-phase change cooling and phase change cooling, as described herein above with respect to the module according to the invention. To complete the non-phase change cooling, heat is extracted from the heat-transfer fluid in liquid phase at the part of the heat exchanging surface arranged in the gastight chamber that is below the liquid level of the heat-transfer fluid. To complete the phase change cooling, heat is extracted from the heat-transfer fluid in gas phase at the part of the heat exchanging surface arranged in the gastight chamber that is above the liquid level of the heat-transfer fluid.

The present invention further relates to a heater, comprising a module according to the invention as described herein above and at least one second heat exchanging surface arranged outside the gastight casing of said module for exchanging heat with its surroundings, said second heat exchanging surface being connected to the heat exchanging surface arranged in the gastight chamber for heat transfer.

The heater can advantageously be used for heating a room by means of heat generated by the heat generating component of the module. This is in particular advantageous when a plurality of electronic computer components of a computer device are included in the module as heat generating components that in use generate heat as a byproduct of the operation of the computer device to perform useful computing tasks. The waste heat as a result of operating the computer device can thus be used to heat a room. Instead of using the heater according to the invention to heat a room, the heater could be utilized as an additional heater for heating fluids in heating systems that include other heating sources. Furthermore the heater according to the invention could be utilized in industrial processes to heat fluids.

In a preferred embodiment of the heater according to the invention, the heat exchanging surface arranged inside the gastight chamber is a surface of a heat exchanger comprising a circuit for a second heat-transfer fluid, and an inlet and an outlet provided in a wall of the gastight chamber, and the heat exchanging surface arranged outside the gastight casing is a surface of a heat exchanger arranged outside the gastight chamber comprising a circuit for said second heat-transfer fluid that is connected to the inlet and the outlet provided in an exterior wall of the gastight casing. For circulating the second heat-transfer fluid through the connected circuits of the heat exchanger inside the gastight chamber and the heat exchanger outside the gastight chamber preferably a pump is provided.

The present invention further relates to a data center having arranged therein a plurality of modules according to the invention, wherein the at least one heat generating component is an electronic computer component.

The present invention further relates to a casing for a module according to the invention as described herein above. The casing according to the invention comprises:
 a mounting member for mounting thereto a heat generating component;
 a gastight chamber having an interior volume having arranged therein a heat exchanging surface for transferring heat from the inside of the gastight chamber to the outside of the gastight chamber;
wherein
 the gastight chamber comprises a displaceable wall by means of which the interior volume of the gastight chamber is variable; and
 the interior volume of the gastight chamber is in pressure equilibrating connection with the ambient pressure outside the gastight chamber via the displaceable wall of the gastight chamber.

In the casing according to the invention the displaceable wall is arranged such that when a heat-transfer fluid in liquid phase is arranged in the gastight chamber said displaceable wall is at least partly in contact with the heat-transfer fluid in liquid phase. Furthermore, the heat exchanging surface is preferably arranged such that when the liquid level of said heat-transfer fluid in liquid phase arranged in the gas-tight chamber drops as a result of a displacement of the displaceable wall, at least a part of the heat exchanging surface emerges from the heat-transfer fluid in liquid phase.

The present invention further relates to a method for filling the casing according to the invention with a heat-transfer fluid, wherein the displaceable wall of the gastight chamber is displaceable between a first position and a second position, wherein with the displaceable wall in its first position the interior volume of the gastight chamber is larger than with the displaceable wall in its second position. The method for filling the casing comprising the steps of:
 displacing the displaceable wall into its second position;
 retaining the displaceable wall in its second position;
 filling the interior volume of the gastight chamber with a heat-transfer fluid in liquid phase while retaining the displaceable wall in its second position;
 sealing the filled interior volume of the gastight chamber gastight;
 releasing the displaceable wall, such that it is allowed to displace between the first position and the second position thereof.

According to an alternative method for filling the casing according to the invention with a heat-transfer fluid, wherein the displaceable wall of the gastight chamber is displaceable between a first position and a second position, wherein with the displaceable wall in its first position the interior volume of the gastight chamber is larger than with the displaceable wall in its second position, the method comprising the steps of:
 partially filling the interior volume of the gastight chamber with a heat-transfer fluid in liquid phase with the displaceable wall in its first position;
 displacing the displaceable wall into its second position;
 retaining the displaceable wall in its second position;
 sealing the filled interior volume of the gastight chamber gastight;
 releasing the displaceable wall, such that it is allowed to displace between the first position and the second position thereof.

This alternative method allows for forcing air out of the gastight chamber when displacing the displaceable wall into its second position before gastight sealing the filled interior volume of the gastight chamber, such that is prevented that air remains in the gastight chamber. Furthermore, this alternative method allows for accurately setting the minimum liquid level of the heat-transfer fluid.

According to a further alternative method for filling the casing according to the invention with a heat-transfer fluid, wherein the displaceable wall of the gastight chamber is displaceable between a first position and a second position, wherein with the displaceable wall in its first position the interior volume of the gastight chamber is larger than with the displaceable wall in its second position, the method comprising the steps of:

partially filling the interior volume of the gastight chamber with a heat-transfer fluid in liquid phase with the displaceable wall in its first position;
heating the heat-transfer fluid;
sealing the filled interior volume of the gastight chamber gastight;
allowing the heat-transfer fluid to cool while allowing the displaceable wall to displace between the first position and the second position thereof.

In this alternative method, by heating the heat-transfer fluid before gastight sealing the filled interior volume of the gastight chamber, the heat-transfer fluid expands, thereby forcing air out of the gastight chamber, such that is prevented that air remains in the gastight chamber. After gastight sealing the gastight chamber, by allowing the heat-transfer fluid to cool, the heat-transfer fluid contracts, thereby displacing the displaceable wall from its first position to its second position.

The present invention is further elucidated in the following description with reference to the accompanying schematic figures. In the figures a non limitative embodiment of the module according to the invention is shown. In the figures.

Figure 1:
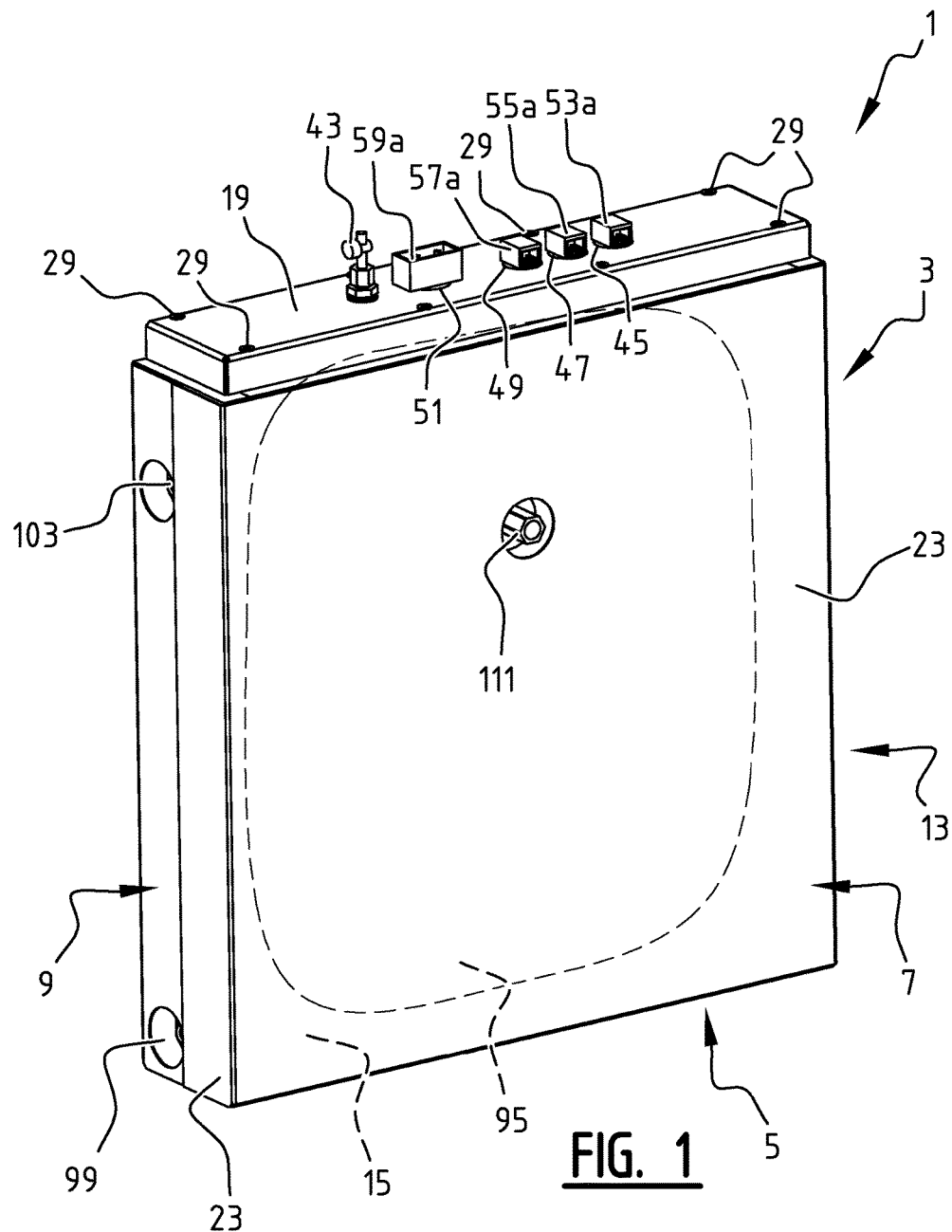
FIG. 1 shows an embodiment of a module according to the invention in perspective view.
Figure 10:
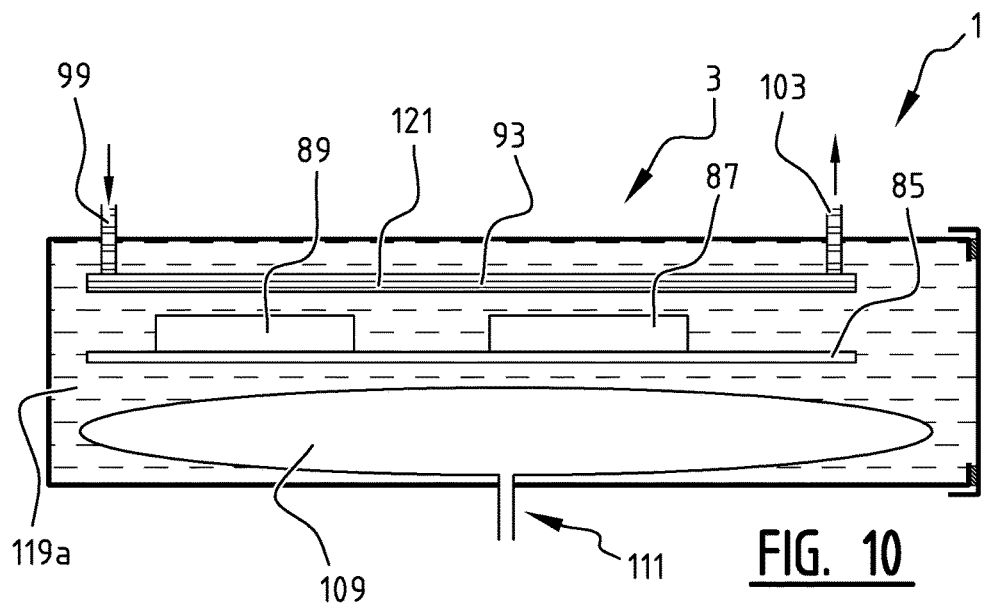
Figure 11:
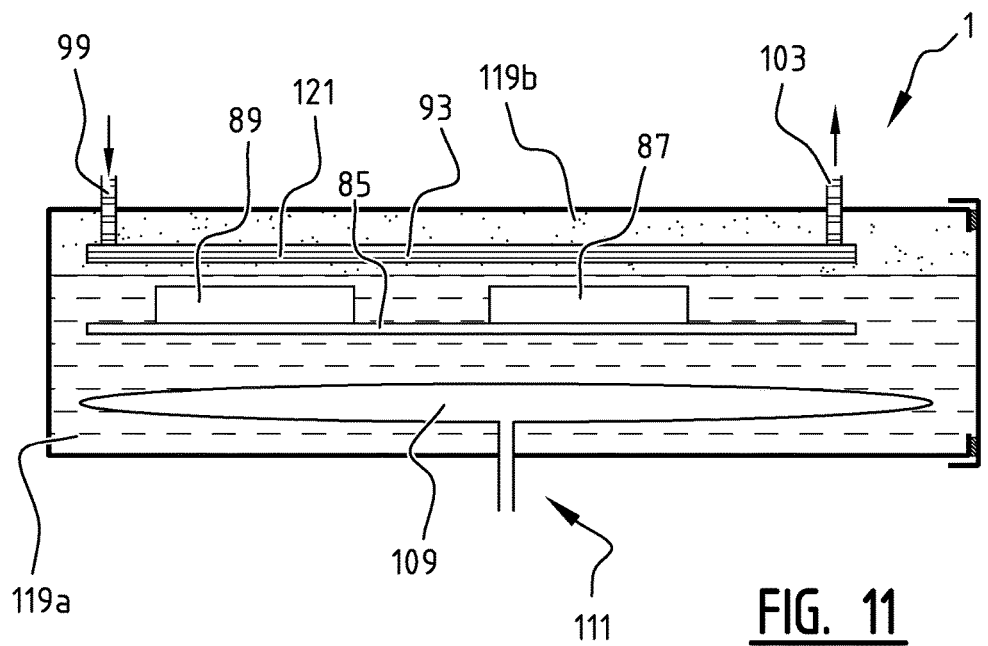
Figure 12:
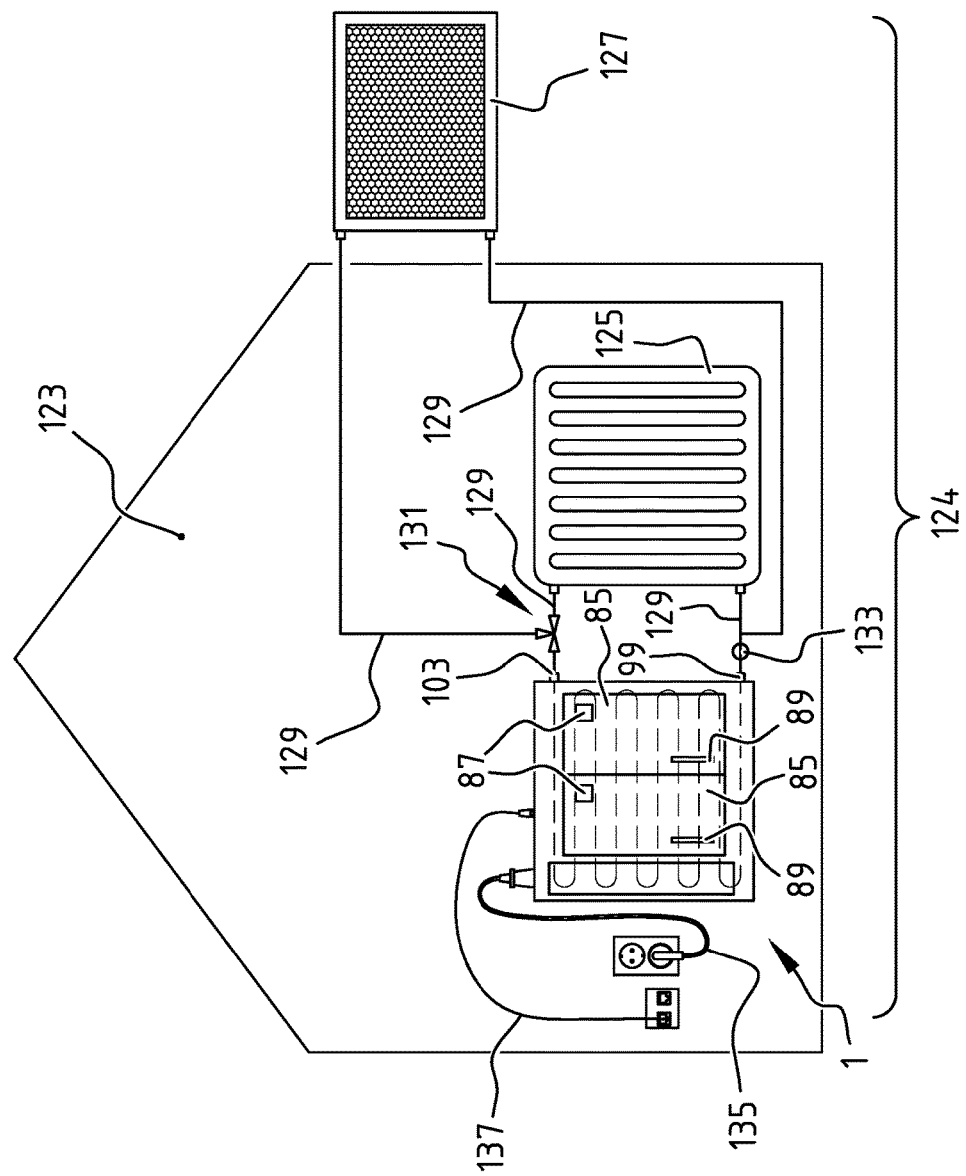

FIGS. 7A to 7E schematically show the steps of filling the gastight casing of the module of FIG. 1;

FIGS. 8 and 9 schematically show two operational modes of the module of FIG. 1 in a first operational orientation of the module;

FIGS. 10 and 11 schematically show two operational modes of the module of FIG. 1 in a second operational orientation of the module;

FIG. 12 shows an embodiment of a heater including the module of FIG. 1.

Figure 2:
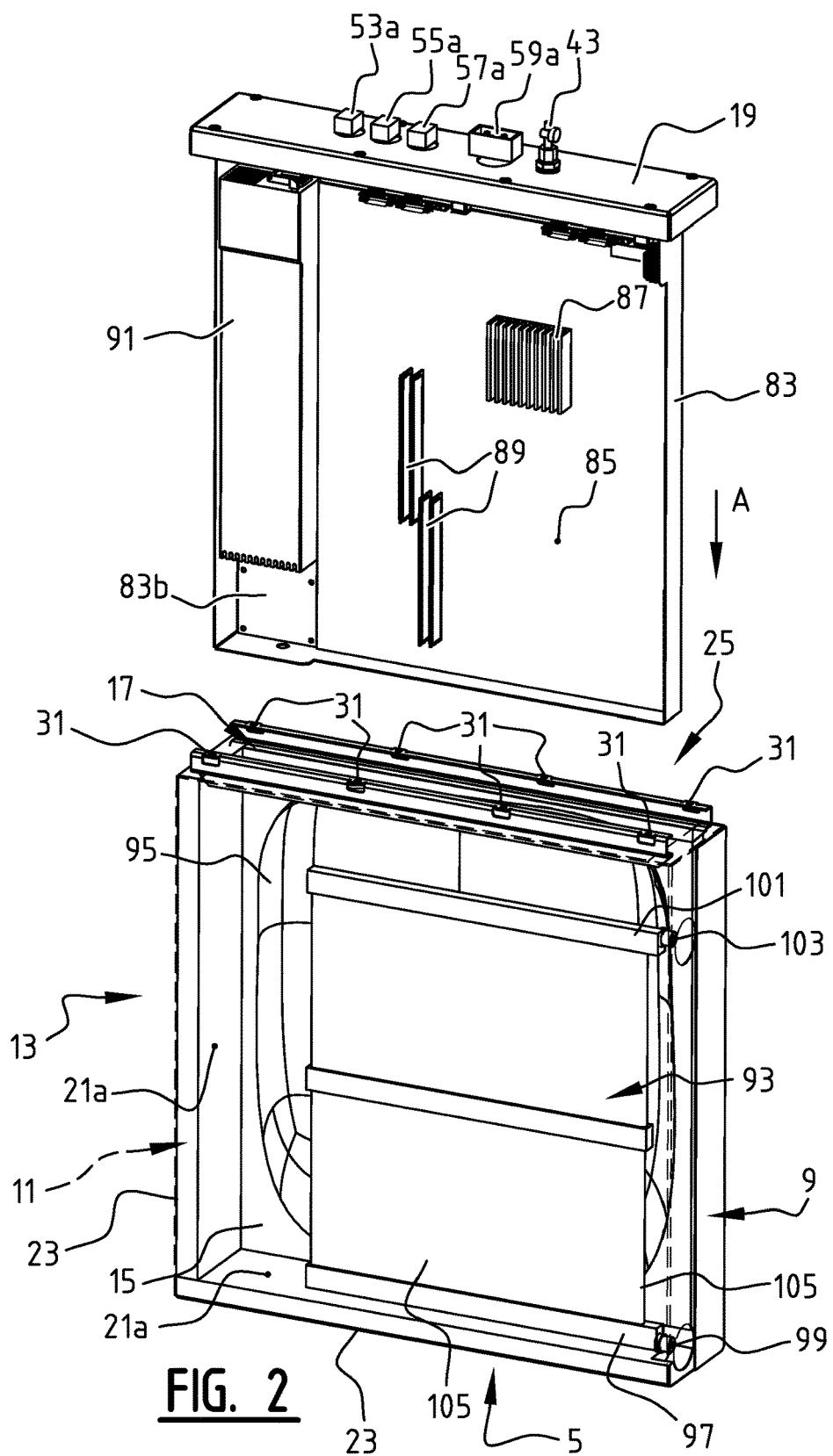
FIGS. 2 and 3 show the module of FIG. 1 in perspective view with parts taken away.
Figure 3:
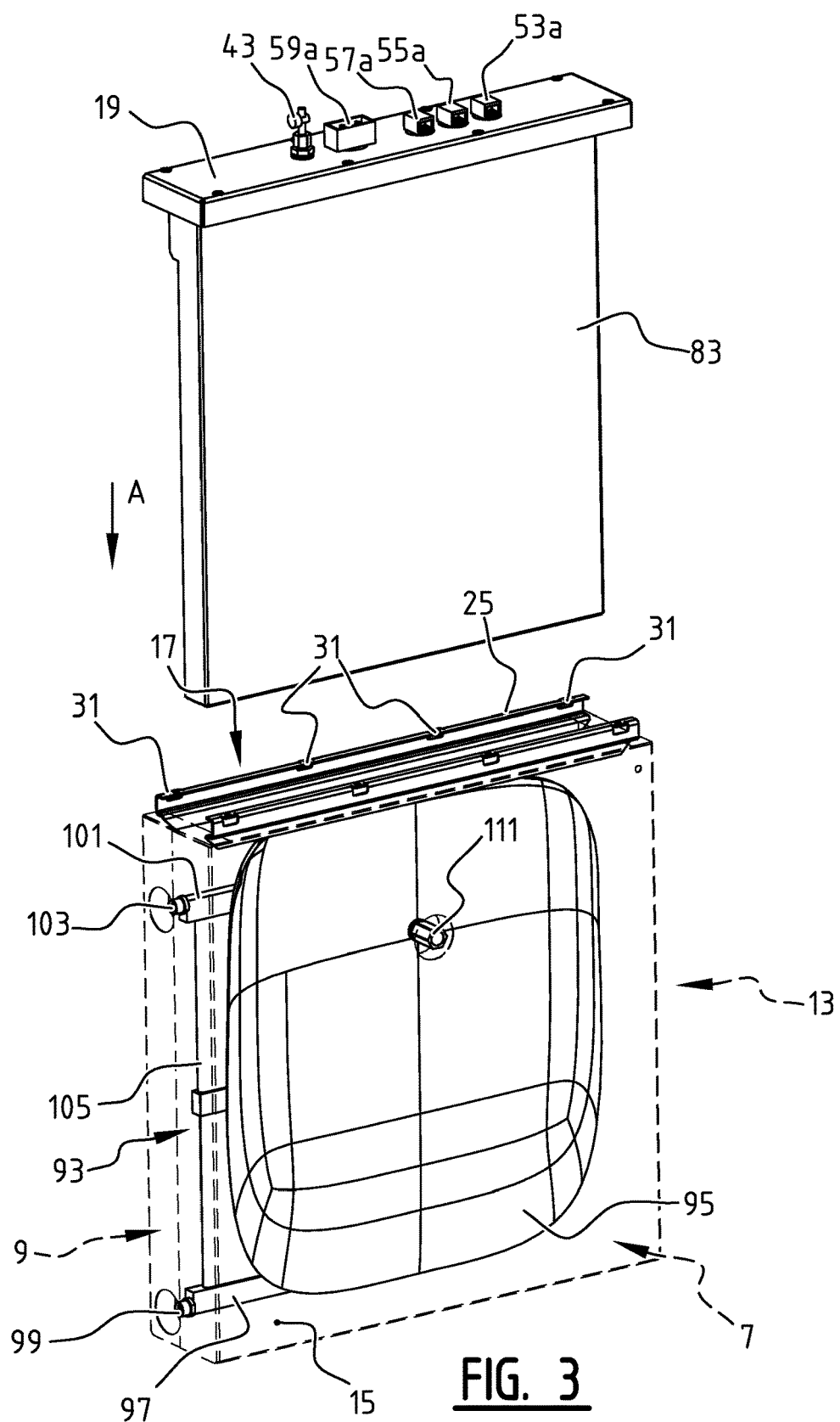
Figure 4:
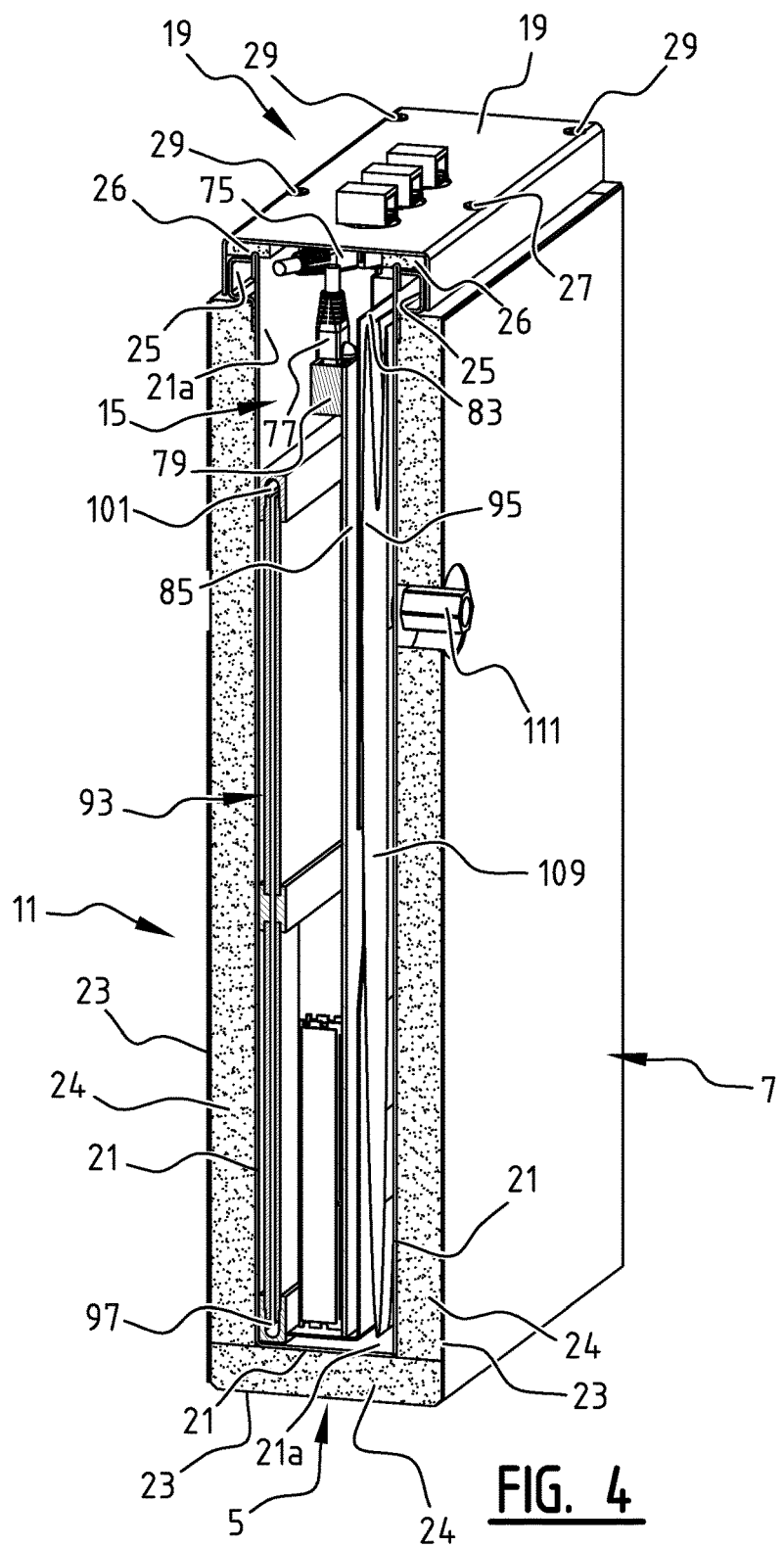
FIG. 4 shows a section through the module of FIG. 1 in perspective view.

In FIGS. 1, 2, 3, and 4 an embodiment of a module 1 according to the invention is shown. The module 1 has a gastight casing 3. The gastight casing 3 comprises a bottom wall 5 and four side walls 7, 9, 11, and 13 that define a fixed interior volume 15 that is accessible via an access opening 17. In FIGS. 1 and 4 the access opening 17 is closed by means of a removable lid 19. In FIGS. 2 and 3 the lid 19 is shown removed from the access opening 17.

The bottom wall 5 and the side walls 7, 9, 11, and 13 each have an interior wall panel 21 of a gastight material, such as stainless steel, and an exterior wall panel 23, that are both adhered to a layer of thermal insulating material 24 to form a sandwich construction in which the interior wall panel 21 and the exterior wall panel 23 function as the skins of the sandwich construction and the layer of thermal insulating material as the core of the sandwich construction. The interior wall panels 21 are joint to form a gastight tank wherein the interior surfaces 21a of the interior wall panels form the interior surface of the gastight casing 3. Along the circumference of the access opening 17 a flange 25 is arranged on the edges of the interior wall panels 21 on which an inner surface 19a of the lid 19 rests when closing the access opening 17.

The lid 19 is made of a gastight material, such as stainless steel. As shown in FIG. 4 a seal member 26 is arranged between the flange 25 and the inner surface 19a of the lid 19 for providing a gastight seal around the access opening 17. Seal member 26 is compressed by means of eight bolts 29 that pass through mounting holes 27 in the lid 19 and that engage a respective threaded hole 31 in the flange 25 along the circumference of the access opening 17. In the lid 19 are arranged five holes that provide access to the interior volume 15 of the gastight casing 3. In one hole 41 a filling conduit with a valve 43 is mounted using a seal member for providing a gastight seal. In the four remaining holes 45, 47, 49, 51 electronic connectors 53, 55, 57, 59 are arranged. The holes with the electronic connectors are closed and sealed by means of two electronic connector structures 61 and 63 that will be described herein below under reference to FIGS. 5 and 6.

Figure 5:
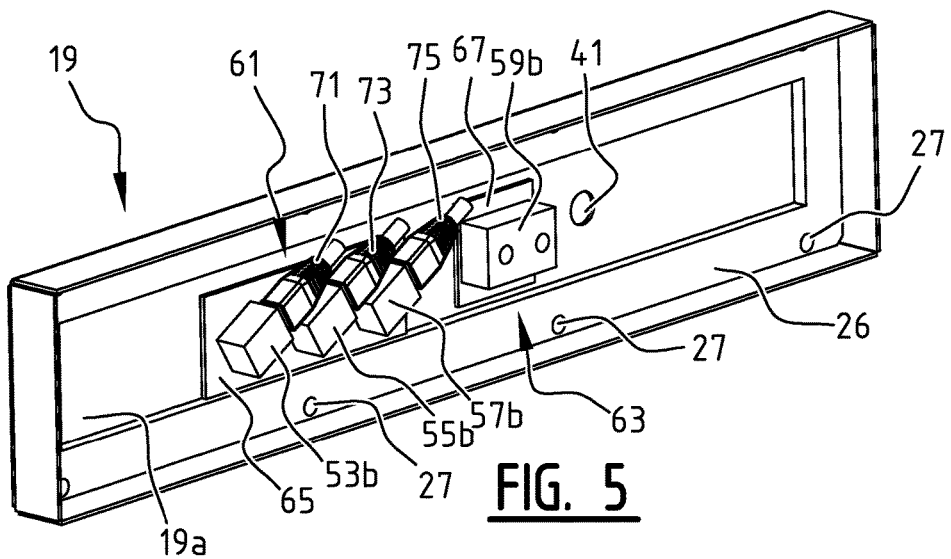
FIG. 5 shows the lid of the module of FIG. 1 in perspective view.
Figure 6:
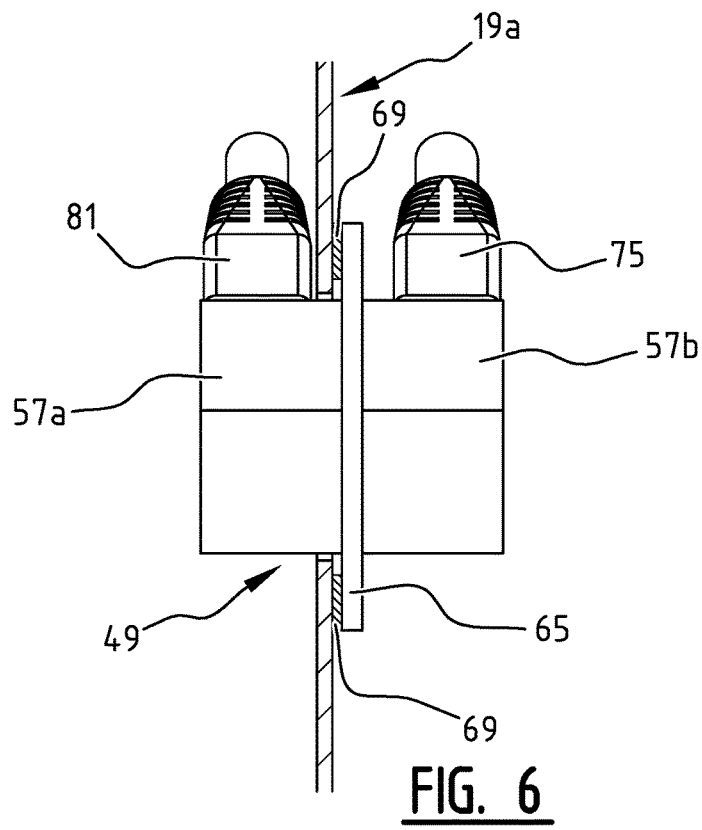
FIG. 6 shows a section through the lid of FIG. 5.

In FIG. 5 two electronic connector structures 61 and 63 are shown. Both comprise a circuit board 65, 67 that is arranged on the inside surface 19a of the lid 19. Circuit board 65 covers three holes 45, 47, 49 in the lid 19. Circuit board 67 covers one hole 51 in the lid 19. As shown in FIG. 6, circuit board 65 is adhered to the inside surface 19a of the lid 19 by means of an adhesive, for instance epoxy resin, wherein the adhesive provides a gastight seal 69 around the holes 45, 47, 49. As apparent from FIG. 6 electrically connected electronic connectors 53a/53b, 55a/55b, 57a/57b are arranged on opposite faces of the circuit board 65, wherein three of the connectors 53a, 55a, 57a extend through the holes 45, 47, and 49. In FIGS. 5 and 6 male end connectors 71, 73, 75, of network cables arranged in the interior volume 15 of the gastight casing 3 are plugged in the female electronic connectors 53b, 55b, 57b arranged in the interior volume 15 of the gastight casing 3. As shown in FIG. 4 the other male end connector 77 of one of the network cables is plugged in a female connector 79 arranged on a heat generating component arranged in the interior volume 15 of the gastight casing 3. As shown in FIG. 6 a male end connector 81 of a network cables arranged outside the interior volume of the gastight casing 3 is plugged in the female electronic connector 57a. Via male end connector 81, female electronic connector 57a, female electronic connector 57b, and a network cable having male end connectors 75 and 77, and female connector 79, the network cables arranged outside the interior volume of the gastight casing 3 is electrically connected to the heat generating component. Connector structure 63 covers hole 51 in the same way connector structure 61 covers holes 45, 47, and 49. Connector structure 63 provides electronic connectors 59a/59b on opposite sides of the lid 19 for connecting power leads for providing power to a heat generating component arranged in the interior volume 15 of the gastight casing 3. The arrangement of heat generating components in the interior volume 15 of the gastight casing 3, will be further described herein below under reference to FIGS. 2 to 4.

As shown in FIGS. 2 and 3, the lid 19 has attached to its interior surface 19a a mounting member embodied by a tray 83. On the tray 83 a plurality of heat generating components are mounted. The heat generating components include electronic computer components, among which a motherboard 85 having arranged thereon a CPU (Central Processing Unit) 87 and memory modules 89, and a PSU (Power Supply Unit) 91 electrically connected to the electronic computer components for supplying power thereto. In the interior volume 15 of the gastight casing 3 guides are provided (not shown) for guiding the movement of the lid 19 and the tray 83 relative to the access opening 17 when removing the lid 19 from the access opening 17 and when arranging the lid 19 on the access opening 17 thereby sliding the tray 83 having mounted thereon the heat generating components into the interior volume 15 of the gastight casing 3.

When sliding the tray 83 from the situation shown in FIGS. 2 and 3 into the interior volume 15 of the gastight casing 3 in the direction of arrow A, the tray 83 having mounted thereon the heat generating components is arranged between a heat exchanger 93 and a bellows 95.

The heat exchanger 93 is arranged in the interior volume 15 against the interior wall panel 21 of side wall 11. The heat exchanger 93 includes a distributor tube 97 having an inlet 99 arranged in side wall 9, a collector tube 101 having an outlet 103 arranged in side wall 9, and one or more channels or tubes extending between the distributor tube 97 and the collector tube 101. The distributor tube 97, the collector tube 101, and the channel(s) or tube(s) extending there between, together form a circuit between the inlet 99 and the outlet 103 for a heat-transfer fluid for transporting heat extracted from the interior volume 15 of the gastight casing 3 at the heat exchanger 93 out of the gastight casing 3. The heat exchanger 93 has a planar structure that extends parallel to the side wall 9 of the gastight casing 3. The one or more channels or tubes define a heat exchanging surface of the heat exchanger 93, which heat exchanging surface extends parallel to the side wall 9 of the gastight casing 3. The heat generating components mounted on tray 83 are also in a planar arrangement. When the tray 83 having mounted thereon the heat generating components is arranged in the interior volume 15 of the gastight casing 3, the heat generating components are arranged beside the heat exchanging surface of the heat exchanger 93, and the planar face of the motherboard 85 having arranged thereon the CPU 87 and memory modules 89 extends parallel to the heat exchanging surface and faces the heat exchanging surface of the heat exchanger 93.

The bellows 95 is arranged in the interior volume 15 against the interior wall panel 21 of side wall 7. The bellows 95 is embodied by a flat, flexible bag of a gastight material. The interior volume 109 of the bellows 95 is in open connection with the outside environment of the gastight casing 3 via an open conduit 111 extending through side wall 7 of the gastight casing 3. When the tray 83 having mounted thereon the heat generating components is arranged in the interior volume 15 of the gastight casing 3, the bellows 95 is arranged between the inner surface 21a of the interior wall panel 21 of side wall 13 and the surface 83a of the tray 83 opposite to the surface 85b of the tray 85 on which the heat generating components are mounted.

Before being able to operate a module 1 according to the invention, the interior volume 15 of the gastight casing 3 has to be filled, at least partly, with a heat-transfer fluid. In FIGS. 7A to 7E the steps of filling the interior volume 15 of the gastight casing 3 with heat-transfer fluid according to one of the embodiments of the method for filling according to the invention is schematically shown.

In FIG. 7A, the module 1 of FIGS. 1 to 4 is schematically shown, with gastight casing 3 comprising a bottom wall 5 and side walls 7 and 11 that define a fixed interior volume 15 that is accessible via an access opening 17, which access opening 17 is closed by means of a removable lid 19. In the interior volume 15 against side wall 11 is arranged a heat exchanger 93 having a heat exchanging surface. In the interior volume 15 against side wall 7 is arranged a bellows 95 having an interior volume 109 that is in open connection with the outside environment of the gastight casing 3 via an open conduit 111 extending through side wall 7 of the gastight casing 3. In between the heat exchanger 93 and the bellows 95 a plurality of heat generating components are arranged, in particular electronic computer components, more in particular a mother board 85, a CPU 87 and a memory module 89. As show in FIG. 7A a filling conduit 113 is provided in the lid 19 that can be selectively opened and closed by means of valve 43.

The gastight wall 95a of bellows 95 provides a freely displaceable wall in the fixed interior volume 15 of the gastight casing 3, dividing said interior volume 15 in a first variable volume chamber and a second variable volume chamber. The first variable volume chamber is a gastight chamber 115 in which the heat exchanger 93 and the heat generating components 85, 87, and 89 are arranged. The second variable volume chamber is the interior volume 109 of the bellows 95 that is in open connection with the outside environment of the gastight casing 3 via an open conduit 111 extending through side wall 7 of the gastight casing 3.

FIG. 7B shows that in a first step for filling the interior volume of the gastight casing 3 with a heat-transfer fluid, the interior volume 109 of the bellows 95 is filled with a fluid, in particular air, via open conduit 111 causing the gastight wall 95a of bellows 95 to displace in the fixed interior volume 15 of the gastight casing 3, such that the interior volume 109 of the bellows 95 increases and the gastight chamber 115 decreases. The open conduit 111 is subsequently plugged with a plug 117.

FIG. 7C shows that in a second step a heat-transfer fluid 119 in liquid phase, in particular a dielectric fluid, is introduced in the gastight chamber 115 via filling conduit 113, while the plug 117 plugs the open conduit 111 to the interior volume 109 of the bellows 95. As shown in FIG. 7D, after filling the gastight chamber 115 with the heat-transfer fluid 119 in liquid phase, the filling conduit 113 is closed by means of the valve 43, such that the gastight chamber 115 is sealed shut and no fluid in gas or liquid phase can enter the gastight chamber 15 from the outside or can leave the gastight chamber 15 to the outside thereof.

FIG. 7E shows that in a subsequent step, the plug 117 is removed from the open conduit 111, such that the interior volume 109 of the bellows 95 is again in open connection with the outside environment of the gastight casing 3. The interior of the gastight chamber 115 that by means of the displaceable wall 95a of the bellows 95 has a variable volume in which the heat exchanger 93, the heat generating components 85, 87, and 89, and the heat-transfer fluid 119 are arranged, is as a result of the interior volume 109 of the bellows 95 being in open connection with the outside environment of the gastight casing 3, in pressure equilibrating connection with the outside environment of the gastight casing 3. The module 1 shown in FIG. 7E is ready for operation.

In FIGS. 8 and 9 the module 1 of FIG. 7E filled with heat-transfer fluid 119 is shown in an orientation wherein the heat exchanger 93 and the heat exchanging surface provided by the heat exchanger 93 extend in a substantially vertical plane.

When in this embodiment the heat generating components 85, 87, and 89 are operated, i.e. the computer device of which motherboard 85, CPU 87, and memory module 89 are electronic computer components is used to perform useful computing tasks, heat is generated by these components. Because the heat-transfer fluid 119 is in heat transfer contact with the heat generating components, heat is transferred from the heat generating components to the heat-transfer fluid in liquid state. This causes the temperature of the heat-transfer fluid in liquid phase to rise and the volume of the heat-transfer fluid in liquid phase to expand. The expansion of the volume of the heat-transfer fluid in liquid phase causes the displaceable wall of the bellows 95 to displace such that the volume of the gastight chamber 115 increases, that the interior volume 109 of the bellows 95 decreases, and that the pressure in the gastight chamber 115 remains substantially equal to the ambient pressure outside the gastight casing 3. The heat extracted from the heat generating components is transferred to the heat exchanging surface provided by the heat exchanger 93 via the heat-transfer fluid in liquid state by conduction. At the heat exchanging surface provided by the heat exchanger 93 heat is transferred from the heat-transfer fluid 119 in liquid phase to a second heat-transfer fluid 121 that enters the heat exchanger 93 via inlet 99 and exits the heat exchanger 93 via outlet 103, thereby transporting the heat out of the gastight chamber 115 and away from the module 1. The rise of temperature of the heat-transfer fluid 119 where it is in heat transfer contact with the heat generating components causes the heated heat-transfer fluid in liquid phase to rise within the heat-transfer fluid in liquid phase. Additionally, the drop of temperature of the heat-transfer fluid 119 where it is in heat transfer contact with the heat exchanging surface of the heat exchanger 93, will cause the cooled heat-transfer fluid in liquid phase to fall within the heat-transfer fluid in liquid phase. As a result natural convection occurs facilitating the transport of heated heat-transfer fluid in liquid phase to the heat exchanging surface and the transport of heat-transfer fluid cooled at the heat exchanging surface back to the heat generating components for reheating.

When in this embodiment the heat generating components 85, 87, and 89 are operated at a temperature at or above a boiling point of the heat-transfer fluid 119, the heat-transfer fluid 119 will be caused to boil where it is in heat-transfer contact with the heat generating components such that heat-transfer fluid in gas-phase is generated in the gastight chamber 115. As a result of the generation of heat-transfer fluid in gas phase, the volume of the heat-transfer fluid 119 expands. The expansion of the volume of the heat-transfer fluid causes the displaceable wall of the bellows 95 to displace such that the volume of the gastight chamber 115 increases, that the interior volume 109 of the bellows 95 decreases, and that the pressure in the gastight chamber 115 remains substantially equal to the ambient pressure outside the gastight casing 3.

The heat-transfer fluid 119 in gas phase will rise in upward direction towards the top of the gastight chamber 115. Because the displaceable wall 95a of the bellows 95 is in contact with the heat-transfer fluid in liquid phase, the displacement of the displaceable wall 95a will result in the liquid level L of the heat-transfer fluid 119 to drop and the heat-transfer fluid 119 in gas phase will rise in upward direction towards the top of the gastight chamber 115 and collect above the liquid level L of the heat-transfer fluid 119. As a result of the drop of the liquid level L of the heat-transfer fluid 119, a part $p_1$ of the heat exchanging surface of the heat exchanger 93 emerges from the heat-transfer fluid 119 in liquid phase.

Above the liquid level L of the heat-transfer fluid, the heat-transfer fluid in gas phase will come into contact with the part of the heat exchanging surface that extends above the liquid level L of the heat-transfer fluid 119 and will condensate on the heat exchanging surface, thereby changing into its liquid phase and returning to the remainder of the heat transfer fluid in liquid phase. The more heat-transfer fluid in gas phase is generated, the more the liquid level L will be forced to drop and the greater will be the part $p_1$ of the heat exchanging surface that extends above the liquid level L, and the lesser will be the part $p_2$ of the heat exchanging surface that remains submerged in the heat-transfer fluid in liquid phase. As a result the more heat-transfer fluid in gas phase is generated, the greater will be the part of the heat exchanging surface that is available above the liquid level for condensation of the heat-transfer fluid in gas phase, and vice versa.

In the situation shown in FIG. 9, the heat transfer via conduction by means of the heat-transfer fluid in liquid phase as described herein above under reference to FIG. 8, remains to occur for the parts of the heat generating components that are below the liquid level L of the heat-transfer fluid and that have a temperature below a boiling point of the heat-transfer fluid. The gas bubbles that are generated and rise towards the liquid level L of the heat-transfer fluid and the droplets heat-transfer fluid that are generated on the heat exchanging surface above the liquid level L of the heat-transfer fluid and that fall back into the heat-transfer fluid in liquid phase, generating motion of the heat-transfer fluid in liquid phase in addition to the natural convection. In the space above the liquid level L of the heat-transfer fluid where the heat-transfer fluid in gas phase collects, also natural convection occurs as a result of the rising of the heat-transfer fluid in gas phase in said space.

When in the situation as described herein above under reference to FIGS. 8 and 9, the volume of the heat-transfer fluid 119 contracts, for instance because of a drop in temperature of the heat-transfer fluid in liquid phase or a drop in the generation of heat-transfer fluid in gas-phase, the displaceable wall displaces, thereby decreasing the interior volume of the gastight chamber 115 and increasing the interior volume 109 of the bellows 95. When for instance starting from the situation shown in FIG. 9, the operation of the heat generating components is stopped or continued with a lower temperature of the heat generating components, the generation of heat-transfer fluid in gas-phase will stop, and after condensation of all the heat-transfer fluid in gas-phase, the module 1 will return to the situation as shown in FIG. 8.

As shown in FIGS. 8 and 9, the module is configured such that in the situation shown in FIG. 9 a part of the motherboard 85 is above the liquid level L. In this situation this emerged part is not in contact with the heat-transfer fluid in liquid phase 119a. This part of the motherboard 85 may rise in temperature by being in contact with the heat-transfer fluid in gas phase 119b. The module is configured such that if the interior volume 109 of the bellows 95 is at its minimum and thus the interior volume of the gastight chamber 115 is at its maximum, the CPU 87 and memory modules 89 are still completely submerged in the heat transfer fluid in liquid phase 119a. As a result the parts that generate most heat are always in contact with heat-transfer fluid in liquid phase 119a. In case the interior volume 109 of the bellows 95 reaches its minimum and thus the interior volume of the gastight chamber 115 reaches its maximum, an increase in pressure inside the gastight chamber relative to the pressure outside the gastight chamber 115 may result. To prevent such an increase in pressure, the flow of the second heat-transfer fluid 121 in the heat exchanger 93 could be increased to increase the heat transfer out of the interior volume 115 of the gastight chamber, such that the condensing rate of the heat-transfer fluid in gas phase 119b increases and the liquid level L rises, or as alternative, the amount of heat generated by the heat generating components could be decreased.

In FIGS. 10 and 11 is shown that, the module 1 as shown in FIGS. 8 and 9, can be operated in a similar way in an orientation wherein the heat exchanger 93 and the heat exchanging surface provided by the heat exchanger 93 extend in a substantially horizontal plane. The main difference is that, as shown in FIG. 11, when the heat exchanging surface of the heat exchanger 93 has emerged from the heat-transfer fluid 119 in liquid phase, no part of the heat exchanging surface remains in contact with the heat-transfer fluid in liquid phase. In the shown embodiment, with the module 1 in the orientation shown in FIGS. 10 and 11, the heat-transfer is thus either via the heat-transfer fluid in liquid phase or via the heat-transfer fluid in gas phase, while with the module 1 in the orientation shown in FIGS. 8 and 9, heat-transfer via the heat-transfer fluid in liquid phase and heat-transfer via the heat-transfer fluid in gas phase are both utilized with a single planar heat exchanger.

In FIG. 12 is shown that the module 1 as shown in FIGS. 1 to 11 can advantageously be used for heating a room 123 by means of heat generated as a byproduct of the operation of the computer device of which the mother boards 85, the CPU's 87, the memory modules 89, and the PSU 91 are part, to perform useful computing tasks. The waste heat as a result of operating the computer device can thus be used to heat the room 123. For this purpose a heater 124 according to the invention is provided that as shown comprises said module 1. As shown the heater 124 further comprises an external heat exchanger 125 arranged in the room 121 and an external heat exchanger 127 arranged in the open air outside the room, that are both connected to the internal heat exchanger 93 inside the module 1 via inlet 99 and outlet 103 via conduits providing a circuit 129 for circulating a heat-transfer fluid through the heat exchangers 93, 125, 127. As shown a three way valve 131 is provided in that circuit. This allows for selective circulation of the heat-transfer fluid through one of the external heat exchangers 125, 127. In case there is a heat demand inside the room 121 the heat-transfer fluid can be circulated through the external heat exchanger 125 inside the room 121, while in case there is no heat demand inside the room 121 the heat-transfer fluid can be circulated through the external heat exchanger 125 outside the room 121. For circulating the heat-transfer fluid through the circuit 129 a pump 133 is provided. As shown in FIG. 12 module 1 is connected to a power wall socket by means of power cable 135, and connected to a network wall socket by means of network cable 137.

The description and drawing merely illustrate the principles of the invention. It will thus be appreciated that those skilled in the art will be able to devise various arrangements that, although not explicitly described or shown herein, embody the principles of the invention and are included within its spirit and scope.

Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The invention claimed is:

1. A gastight chamber for cooling a heat generating component, the gastight chamber
   having an interior volume configured to receive therein:
      a heat-transfer fluid in liquid phase that is in heat transfer contact with at least part of the heat generating component, wherein the gastight chamber comprises:
      a heat exchanging surface for transferring heat from the heat-transfer fluid out of the gastight chamber; and
   a displaceable wall by means of which the interior volume of the gastight chamber is variable; and
      the interior volume of the gastight chamber is in pressure equilibrating connection with the ambient pressure outside the gastight chamber via the displaceable wall of the gastight chamber;
   characterized in that
   the displaceable wall is at least partly in contact with the heat-transfer fluid in liquid phase; and
   the heat exchanging surface is arranged such that when a liquid level of the heat-transfer fluid in liquid phase drops as a result of a displacement of the displaceable wall, at least a part of the heat exchanging surface emerges from the heat-transfer fluid in liquid phase.

2. Gastight chamber according to claim 1, wherein
   the heat-transfer fluid has a boiling point being lower than or equal to an operating temperature of the heat generating component in use; and
   the heat exchanging surface is arranged such that at least in use at said operating temperature of the heat generating component at least part of the heat exchanging surface extends above the liquid level of the heat-transfer fluid.

3. Gastight chamber according to claim 2, wherein
   the heat exchanging surface is arranged such that at least in use at said operating temperature of the heat generating component a part of the heat exchanging surface extends above the liquid level of the heat-transfer fluid and a part is submerged in the heat-transfer fluid in liquid phase, wherein preferably the heat exchanging surface in use extends parallel to the vertical plane.

4. Gastight chamber according to claim 2, wherein
   the heat exchanging surface is arranged such that at least in use at said operating temperature of the heat generating component the whole heat exchanging surface extends above the liquid level of the heat-transfer fluid, wherein preferably the heat exchanging surface in use extends parallel to the horizontal plane.

5. Gastight chamber according to claim 1, wherein
   a nucleation promoting structure is arranged in the interior volume where the heat-transfer fluid is in heat exchanging contact with the heat generating component.

6. Gastight chamber according to claim 1, wherein
   the heat exchanging surface is arranged such that in use when the heat generating component is not operated, the whole heat exchanging surface is submerged in the heat-transfer fluid in liquid phase.

7. Gastight chamber according to claim 1, wherein
the gastight chamber being arranged inside a module that comprises a gastight casing having a fixed interior volume having arranged therein the displaceable wall, the displaceable wall defining in the fixed interior volume of the gastight casing a gastight first variable volume chamber being the gastight chamber in which the heat-transfer fluid and the heat exchanging surface are arranged, and a second variable volume chamber, the internal volume of the second variable volume chamber being in pressure equilibrating connection with the ambient pressure outside the gastight casing.

8. Gastight chamber according to claim 7, wherein
a bellows is arranged in a volume enclosed by the gastight casing, said bellows providing the displaceable wall, the bellows dividing said volume enclosed by the gastight casing in which it is arranged in the first variable volume chamber and the second variable volume chamber, the interior of the bellows defining the second variable volume chamber, and the bellows being connected to the gastight casing for pressure equation between the interior of the bellows and the outside environment of the gastight casing, wherein preferably the bellows comprises a flexible bag of a gastight material.

9. Gastight chamber according to claim 8, wherein
the interior of the bellows is in open connection with the outside environment of the gastight casing via an open conduit extending through an exterior wall of the gastight casing.

10. Gastight chamber according to claim 7, wherein
an exterior wall of the gastight casing comprises a laminate of a gastight wall panel having an inside surface facing the interior of the gastight casing and an outside surface, and a layer of a thermal insulating material adhered to the outside surface of said gastight wall panel, wherein preferably an exterior wall panel is adhered to the layer thermal insulating material on the opposite side thereof, such that a sandwich construction is formed in which the interior wall panel and the exterior wall panel function as the skins of the sandwich construction and the layer of thermal insulating material as the core of the sandwich construction.

11. Gastight chamber according to claim 7, wherein
an exterior wall of the gastight casing comprises a sandwich construction comprising an interior wall panel and an exterior wall panel as skins having arranged there between a honeycomb core layer, preferably of a material having a relatively low thermal conductivity, wherein the cells of the honeycomb core layer are vacuumized.

12. Gastight chamber according to claim 7, wherein
the gastight casing comprises an access opening to its interior and a removable lid for gastight closing said access opening.

13. Gastight chamber according to claim 12, wherein
the lid has attached to its interior surface a mounting member for mounting thereto the heat generating component, the mounting member preferably being a tray, wherein more preferably guides are provided for guiding the movement of the lid and the tray relative to the access opening when removing the lid from the access opening and when arranging the lid on the access opening.

14. Gastight chamber according to claim 1, wherein
said at least one heat generating component includes an electronic computer component that in use generates heat.

15. Gastight chamber according to claim 1,
wherein
said at least one heat generating component includes a power supply.

16. Gastight chamber according to claim 1, wherein
the heat generating component is arranged in the interior volume of the gastight chamber.

17. Gastight chamber according to claim 1, wherein
at least one electronic connector structure is provided in a wall of the gastight chamber for electronically connecting to the heat generating component from the outside of the gastight chamber.

18. Gastight chamber according to claim 17, wherein
the electronic connector structure comprises a circuit board that is arranged on the inside or outside surface of an exterior wall of the gastight chamber covering a hole in said wall of the gastight casing, wherein a gastight seal is arranged around the hole between the surface of the exterior wall of the gastight chamber and the surface of the circuit board facing said surface of the exterior wall, wherein preferably the circuit board that is adhered to the inside or outside surface of an exterior wall of the gastight chamber by means of an adhesive, preferably epoxy resin, wherein the adhesive provides a gastight seal around said hole.

19. Gastight chamber according to claim 18, wherein
an electronic connector is arranged on at least one face of the circuit board.

20. Gastight chamber according to claim 1, wherein
the heat-transfer fluid is a dielectric fluid.

21. Gastight chamber according to claim 1, wherein
the heat exchanging surface extends parallel to a plane and the heat generating component has a planar face extending parallel to said plane and facing said heat exchanging surface.

22. Gastight chamber according to claim 1, wherein
the heat exchanging surface in use extends parallel to the vertical plane and the heat generating component is arranged underneath or besides the heat exchanging surface.

23. Gastight chamber according to claim 1, wherein
the heat exchanging surface in use extends parallel to the horizontal plane and the heat generating component is arranged underneath the heat exchanging surface.

24. Gastight chamber according to claim 1, wherein
the heat exchanging surface is a surface of at least one heat exchanger comprising a circuit for a second heat-transfer fluid, and an inlet and an outlet provided in a wall of the gastight chamber.

25. Gastight chamber according to claim 24, wherein
the heat exchanger comprises capillary channels in a flat structure.

26. A method for operating a gastight chamber for cooling a heat generating component, the gastight chamber having an interior volume configured to receive therein a heat-transfer fluid in liquid phase that is in heat transfer contact with at least part of the heat generating component, wherein the gastight chamber comprises a heat exchanging surface for transferring heat from the heat-transfer fluid out of the gastight chamber and a displaceable wall by means of which the interior volume of the gastight chamber is variable, and wherein the interior volume of the gastight chamber is in pressure equilibrating connection with the ambient pressure outside the gastight chamber via the displaceable wall of the gastight chamber, the displaceable wall being in at least partly in contact with the heat-transfer fluid in liquid phase, the heat exchanging surface being arranged such that when a liquid level of the heat-transfer fluid in liquid phase drops as a result of a displacement of the displaceable wall, at least a part of the heat exchanging surface emerges from the heat-transfer fluid in liquid phase, the method comprising the steps of:
 operating the heat generating component at a temperature below a boiling point of the heat-transfer fluid; and
 transferring heat from the heat generating component to the heat-transfer fluid in liquid phase, thereby causing the heat-transfer fluid in liquid phase to expand and the displaceable wall to displace such that the volume of the gastight chamber increases.

27. A method for operating a gastight chamber for cooling a heat generating component, the gastight chamber having an interior volume configured to receive therein a heat-transfer fluid in liquid phase that is in heat transfer contact with at least part of the heat generating component, wherein the gastight chamber comprises a heat exchanging surface for transferring heat from the heat-transfer fluid out of the gastight chamber and a displaceable wall by means of which the interior volume of the gastight chamber is variable, and wherein the interior volume of the gastight chamber is in pressure equilibrating connection with the ambient pressure outside the gastight chamber via the displaceable wall of the gastight chamber, the displaceable wall being in at least partly in contact with the heat-transfer fluid in liquid phase, the heat exchanging surface being arranged such that when a liquid level of the heat-transfer fluid in liquid phase drops as a result of a displacement of the displaceable wall, at least a part of the heat exchanging surface emerges from the heat-transfer fluid in liquid phase, the method comprising the steps of:
 operating the heat generating component at a temperature at or above a boiling point of the heat-transfer fluid;
 transferring heat from the heat generating component to the heat-transfer fluid in liquid phase, thereby causing the heat-transfer fluid to boil where it is in heat-transfer contact with the heat generating component such that heat-transfer fluid in gas phase is generated in the gastight chamber, and the displaceable wall to displace such that the volume of the gastight chamber increases; wherein
 the generated heat-transfer fluid in gas phase collects above the liquid level of the heat-transfer fluid forcing the liquid level to drop such that at least a part of the heat exchanging surface emerges from the heat-transfer fluid in liquid phase.

28. A module for cooling a heating generating component, the module, comprising:
 a gastight chamber being arranged inside the gastight casing, the gastight chamber having an interior volume configured to receive therein a heat-transfer fluid in liquid phase that is in heat transfer contact with at least part of the heat generating component, wherein the gastight chamber comprises a heat exchanging surface for transferring heat from the heat-transfer fluid out of the gastight chamber and a displaceable wall by means of which the interior volume of the gastight chamber is variable, and wherein the interior volume of the gastight chamber is in pressure equilibrating connection with the ambient pressure outside the gastight chamber via the displaceable wall of the gastight chamber, the displaceable wall being in at least partly in contact with the heat-transfer fluid in liquid phase, the heat exchanging surface being arranged such that when a liquid level of the heat-transfer fluid in liquid phase drops as a result of a displacement of the displaceable wall, at least a part of the heat exchanging surface emerges from the heat-transfer fluid in liquid phase; and
 a mounting member for mounting thereto a heat generating component.

29. Heater, comprising:
 at least one module according to claim 28;
 at least one heat exchanging surface arranged outside the gastight chamber of said module for exchanging heat with the surroundings of the heat exchanging surface, said heat exchanging surface being connected to the heat exchanging surface arranged inside the gastight chamber for exchanging heat.

30. Heater according to claim 29, comprising:
 wherein the heat exchanging surface arranged outside the gastight chamber is a surface of an exterior heat exchanger comprising a circuit for said second heat-transfer fluid that is connected to the inlet and the outlet provided in an exterior wall of the gastight chamber, wherein preferably a pump is provided for circulating the second heat-transfer fluid through the connected circuits of the interior and exterior heat exchanger.

31. Data center having arranged therein a plurality of modules according to claim 28, wherein said at least one heat generating component is an electronic computer component.

32. Method for filling a gastight casing with a heat-transfer fluid, a gastight chamber being arranged inside the gastight casing, the gastight chamber having an interior volume configured to receive therein a heat-transfer fluid in liquid phase that is in heat transfer contact with at least part of the heat generating component, wherein the gastight chamber comprises a heat exchanging surface for transferring heat from the heat-transfer fluid out of the gastight chamber and a displaceable wall by means of which the interior volume of the gastight chamber is variable, and wherein the interior volume of the gastight chamber is in pressure equilibrating connection with the ambient pressure outside the gastight chamber via the displaceable wall of the gastight chamber, the displaceable wall being in at least partly in contact with the heat-transfer fluid in liquid phase, the heat exchanging surface being arranged such that when a liquid level of the heat-transfer fluid in liquid phase drops as a result of a displacement of the displaceable wall, at least a part of the heat exchanging surface emerges from the heat-transfer fluid in liquid phase, wherein the displaceable wall of the gastight chamber is displaceable between a first position and a second position, wherein with the displaceable wall in its first position the interior volume of the gastight chamber is larger than with the displaceable wall in its second position, the method comprising the steps of:
 displacing the displaceable wall into its second position;
 retaining the displaceable wall in its second position;
 filling the interior volume of the gastight chamber with a heat-transfer fluid in liquid phase while retaining the displaceable wall in its second position;
 sealing the filled interior volume of the gastight chamber gastight;
 releasing the displaceable wall, such that it is allowed to displace between the first position and the second position thereof.

33. Method for filling a gastight casing with a heat-transfer fluid, a gastight chamber being arranged inside the gastight casing, the gastight chamber having an interior volume configured to receive therein a heat-transfer fluid in liquid phase that is in heat transfer contact with at least part of the heat generating component, wherein the gastight chamber comprises a heat exchanging surface for transferring heat from the heat-transfer fluid out of the gastight chamber and a displaceable wall by means of which the interior volume of the gastight chamber is variable, and wherein the interior volume of the gastight chamber is in pressure equilibrating connection with the ambient pressure outside the gastight chamber via the displaceable wall of the gastight chamber, the displaceable wall being in at least partly in contact with the heat-transfer fluid in liquid phase, the heat exchanging surface being arranged such that when a liquid level of the heat-transfer fluid in liquid phase drops as a result of a displacement of the displaceable wall, at least a part of the heat exchanging surface emerges from the heat-transfer fluid in liquid phase, wherein the displaceable wall of the gastight chamber is displaceable between a first position and a second position, wherein with the displaceable wall in its first position the interior volume of the gastight chamber is larger than with the displaceable wall in its second position, the method comprising the steps of:
   partially filling the interior volume of the gastight chamber with a heat-transfer fluid in liquid phase with the displaceable wall in its first position;
   displacing the displaceable wall into its second position;
   retaining the displaceable wall in its second position;
   sealing the filled interior volume of the gastight chamber gastight;
   releasing the displaceable wall, such that it is allowed to displace between the first position and the second position thereof.

34. Method for filling a gastight casing with a heat-transfer fluid, a gastight chamber being arranged inside the gastight casing, the gastight chamber having an interior volume configured to receive therein a heat-transfer fluid in liquid phase that is in heat transfer contact with at least part of the heat generating component, wherein the gastight chamber comprises a heat exchanging surface for transferring heat from the heat-transfer fluid out of the gastight chamber and a displaceable wall by means of which the interior volume of the gastight chamber is variable, and wherein the interior volume of the gastight chamber is in pressure equilibrating connection with the ambient pressure outside the gastight chamber via the displaceable wall of the gastight chamber, the displaceable wall being in at least partly in contact with the heat-transfer fluid in liquid phase, the heat exchanging surface being arranged such that when a liquid level of the heat-transfer fluid in liquid phase drops as a result of a displacement of the displaceable wall, at least a part of the heat exchanging surface emerges from the heat-transfer fluid in liquid phase, wherein the displaceable wall of the gastight chamber is displaceable between a first position and a second position, wherein with the displaceable wall in its first position the interior volume of the gastight chamber is larger than with the displaceable wall in its second position, the method comprising the steps of:
   partially filling the interior volume of the gastight chamber with a heat-transfer fluid in liquid phase with the displaceable wall in its first position;
   heating the heat-transfer fluid;
   sealing the filled interior volume of the gastight chamber gastight;
   allowing the heat-transfer fluid to cool while allowing the displaceable wall to displace between the first position and the second position thereof.

* * * * *